(12) United States Patent
Orio

(10) Patent No.: US 7,913,153 B2
(45) Date of Patent: Mar. 22, 2011

(54) ARITHMETIC CIRCUIT

(75) Inventor: Masao Orio, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 1139 days.

(21) Appl. No.: 11/634,957

(22) Filed: Dec. 7, 2006

(65) Prior Publication Data

US 2007/0162836 A1 Jul. 12, 2007

(30) Foreign Application Priority Data

Dec. 20, 2005 (JP) ................... 2005-366401

(51) Int. Cl.
*H03M 13/00* (2006.01)
(52) U.S. Cl. ......... 714/794; 714/795; 375/262; 375/341
(58) Field of Classification Search ............... 714/791, 714/794–796; 375/262, 341
See application file for complete search history.

(56) References Cited

U.S. PATENT DOCUMENTS

| 7,162,675 B2 * | 1/2007 | Das et al. ............... 714/751 |
| 2007/0011601 A1 * | 1/2007 | Griseta et al. ............ 714/805 |

FOREIGN PATENT DOCUMENTS

| EP | 1 162 750 A1 | 12/2001 |
| EP | 1 507 332 A1 | 2/2005 |
| JP | 2002-100995 | 5/2002 |
| JP | 2002-344330 | 11/2002 |
| JP | 2004-80508 | 3/2004 |
| JP | 2004-194326 | 7/2004 |

OTHER PUBLICATIONS

A. Taffin, "Generalized stopping criterion for iterative decoders", IEEE Electronics Letters, vol. 39, No. 13, Jun. 26, 2003.
United Kingdom Search Report dated Jun. 30, 2008.
United Kingdom combined Search Report and Office Action dated Aug. 28, 2007.

* cited by examiner

*Primary Examiner* — Guy J Lamarre
(74) *Attorney, Agent, or Firm* — McGinn IP Law Group, PLLC

(57) ABSTRACT

An arithmetic circuit includes a NOR circuit for outputting 1-bit inverted logical OR sf from all of a first bit group x(6) to x(10) containing 0 or more high-order bit of a path metric value composed of a plurality of bits, an inverter for inverting each bit of a second bit group x(2) to x(5) and outputting a third bit group rs(0) to rs(3), an AND circuit for outputting a fourth bit group ns(0) to ns(3) that contain results of calculating a logical AND of sf and rs(0) to rs(3), and a CF output section for outputting a correction factor CF based on ns(0) to ns(3).

3 Claims, 16 Drawing Sheets

ARITHMETIC CIRCUIT

BACKGROUND OF THE INVENTION

1. Field of the Invention

The present invention relates to an arithmetic circuit for correcting an approximate value that is computed by the Max-Log-MAP algorithm based on the Log-MAP algorithm.

2. Description of Related Art

In digital communications system, an error correcting code for correcting an error occurring in a transmission line is used. Particularly in mobile communication systems where the radio field intensity varies drastically due to fading and thereby an error is likely to occur, high correction capability is required for error correcting codes. Turbo codes, which are one example of error correcting codes, are notable as the codes having the error correction capability which is close to the Shannon limit and employed in the W-CDMA (Wideband Code Division Multiple Access) or CDMA-2000 as the third-generation mobile communication system, for example. This is disclosed in Japanese Unexamined Patent Application Publications Nos. 2004-80508, 2004-194326, 2002-344330, 2002-100995, and A. Taffin, "Generalized stopping criterion for iterative decoders", IEEE Electronics Letters, 26 Jun. 2003, Vol. 39, No. 13, for example.

FIG. 15 is a block diagram showing the structure of a typical encoding device for generating turbo codes. The encoding device 101 may be placed on the transmitting side of a communication system in order to encode information bits (systematic bits: systematic portion) U as pre-encoded data into turbo codes as parallel concatenated convolutional codes (PCCCs) and output the turbo codes to the outside such as a transmission line. The turbo codes are not limited to the parallel concatenated convolutional codes and may be any codes which can be turbo-decoded, such as serial concatenated convolutional codes.

The encoding device 101 includes a first encoder 102 and a second encoder 103 which serve as systematic convolutional coders, and an interleaver 104 which interleaves (i.e. rearranges) data as shown in FIG. 15.

The first encoder 102 encodes input systematic portion U to generate redundancy bits (hereinafter as the parity bits) P1 and outputs the parity bits P1 to the outside. The interleaver 104 rearranges each bit of the input systematic portion U into a prescribed interleaved pattern to generate a systematic portion $U^{int}$ and outputs the generated systematic portion $U^{int}$ to the second encoder 103. The second encoder 103 encodes the systematic portion $U^{int}$ to generate parity bits P2 and outputs the parity bits P2 to the outside.

In sum, the encoding device 101 generates the systematic portion U, the parity bits P1, the systematic portion $U^{int}$, and the parity bits P2. A pair of the systematic portion U and the parity bits P1 (U, P) is called a first elemental code E, and a pair of the systematic portion $U^{int}$ and the parity bits P2 ($U^{int}$, P2) is called a second elemental code $E^{int}$.

The turbo decoding has two features of (1) using a plurality of systematic encoders having a relatively simple and small structure, and (2) each encoder being connected to the information bits as an input to the encoder through the interleaver (rearranging element).

The feature (2) aims to generate different codeword sequences in different encoders by inputting the information bits with rearranged sequences to the encoder. The decoded result of each codeword is thus complemented between the codewords in the decoding side to thereby improve the error correction capability.

The feature (1) aims to use information bits for mutual complementation of decoded results between codewords. For example, the 3GPP (3rd Generation Partnership Project) mandates the use of two 8-state Systematic Convolutional Coders as the feature (1). The 3GPP is working on the standardization of the third-generation mobile communication system such as W-CDMA.

A pair of outputs {U, P1} of an encoder 1 in FIG. 15 is called a first elemental code, and the other pair of outputs {$U^{int}$, P2} is called a second elemental code. The bit $U^{int}$ is not actually output, and three bits of U, P1, and P2 are output to the subsequent stage. Although termination bits are actually output at the same time, they are ignored for simplification of the description. On this account, the coding rate of turbo codes defined by the 3GPP standard is ⅓.

Decoding such encoded turbo codes is called turbo decoding. In the turbo decoding process, decoding is performed iteratively as exchanging extrinsic information between a first decoder for decoding the first elemental code E and a second decoder for decoding the second elemental code $E^{int}$. The number of decoders is not limited to two, and two or more stages of decoders may be used in accordance with the number of elemental codes of the turbo codes.

FIG. 16 shows a typical decoding device for turbo decoding. The turbo decoding has one feature of (1) iterating the processing as exchanging the extrinsic information among a plurality of elemental codes.

As shown in FIG. 16, a typical decoding device 201 includes a first decoder 202, a second decoder 203, an interleaved memory 204, a de-interleaved memory 205, and a hard decision/CRC decision section 206.

The turbo decoding process in the decoding device 201 having such a configuration includes the following steps.

(A) Reading extrinsic information of the second decoder 203 from the de-interleaved memory 205 and inputting the extrinsic information and a first elemental code to the first decoder 202. Then, outputting extrinsic information from the first decoder 202 and writing it to the interleaved memory 204.

(B) Reading the extrinsic information of the first decoder 202 from the interleaved memory 204 and inputting the extrinsic information and a second elemental code to the second decoder 203. Then, outputting extrinsic information from the second decoder 203 and writing it to the de-interleaved memory 205.

(C) In the final iteration of the decoding process, reading a log likelihood ratio LLR of the second decoder 203 from the de-interleaved memory 205, making the hard decision in the hard decision/CRC decision section 206, and finally performing error checking by CRC.

In the turbo decoding process, the step (A) is performed first. The extrinsic information from the second decoder 203 is an initial value (=0) in this step. Then, the step (B) is performed and further the step (A) is performed again. Subsequently, the steps (B) and (A) are iterated an arbitrary number of times. In the final iteration, the step (B) is performed. At this step, the second decoder 203 outputs the log likelihood ratio rather than the extrinsic information. After that, the step (C) is performed finally.

Because the turbo codes are systematic bits, the information bits U are contained in a received sequence. The extrinsic information is a value (priori value) indicating the likelihood of "0" (equivalent with the likelihood of "1"), which is predefined for the information bits U prior to the decoding. The turbo decoding is the process that exchanges (mutually complements) the probability that each information bit is "0" in the decoding between the first and second elemental codes to thereby improve the accuracy of the probability and enhance the error correction capability.

The extrinsic information can be generated from the output of a soft-output decoder (log likelihood ratio LLR). There are two types of generating the soft output: MAP and SOVA. The MAP algorithm is generally more widely used because of its higher error correction capability. MAP, Log-MAP, and Max-Log-MAP are mainly known as the MAP algorithm.

Prior to describing the MAP, Log-MAP, and Max-Log-MAP algorithms, the log likelihood ratio LLR is described hereinbelow. Just like the extrinsic information, the log likelihood ratio LLR also indicates the likelihood of "0" of the information bits U. Though the extrinsic information is a priori value, the log likelihood ratio LLR is called a posteriori value. The log likelihood ratio is represented by the following Expression 1:

Log likelihood ratio:

$$L(u_k) = \log\left(\frac{P(u_k = +1 \mid y)}{P(u_k = -1 \mid y)}\right) \quad (1)$$

where
P( ) indicates a probability,
$u_k$ indicates a k-th information bit,
y indicates a received sequence,
$P(u_k=+1|y)$ indicates a probability that the k-th information is +1(="0") when receiving the received sequence y, and
$P(u_k=-1|y)$ indicates a probability that the k-th information is −1(="1") when receiving the received sequence y.

$$\hat{u}_k = \text{sign}[L(u_k)] \quad (2)$$

where sign [ ] indicates a hard decision.

The log likelihood ratio LLR is represented by Expression 1. In this expression, "0" is represented by +1, and "1" is represented by −1. The log ratio of the probability of being "0" and the probability of being "1" is used to obtain a likelihood which indicates either "0" or "1" is more likely. If the probability of being "0" is higher than the probability of being "1", the ratio of those probabilities is larger than 1, and the log ratio is larger than 0 (positive number). On the other hand, if the probability of being "1" is higher than the probability of being "0", the ratio of those probabilities is a value below the decimal point which is less than 1, and the log ratio is smaller than 0 (negative number). Accordingly, the probability of being either "0" or "1" can be determined from the sign (positive or negative) of the log likelihood ratio. If the probability of being "0" and the probability of being "1" are equal, their ratio is 1 and the log ratio is 0, thus being unclear as to which probability is higher.

Expression 2 represents the log likelihood ratio LLR in regard to the k-th information bit $u_k$. The $u_k$ in Expression 2 is an estimate for the k-th information bit in the receiving side, which is a result of the hard decision of LLR (="0" or "1"). The hard decision sign[ ] is the processing of retrieving a sign binary bit, and it indicates "0" if the value is positive or "1" if the value is negative. Therefore, Expression 2 represents the hard decision of LLR for the k-th information bit.

The MAP, Log-MAP, and Max-Log-MAP algorithms are described hereinafter.

MAP (Maximum A Posteriori Probability) Algorithms

MAP, which stands for Maximum A posteriori Probability, is a decoding algorithm for maximizing LLR that is a posteriori value (A posteriori probability) and also called a posteriori probability maximization decoding.

The MAP algorithm calculates a log likelihood ratio $L(u_k)$ using the following Expression 3 which is a result of several formula conversions on the above Expression (1). In this expression, γ indicates a transition probability of trellis, α indicates an achievement probability to each state of trellis upon transition from the starting point to the endpoint, and β indicates an achievement probability from the endpoint reversely. The trellis is a state transition diagram of an encoder deployed on the time base. This is called a trellis diagram.

Log likelihood ratio $$L(u_k) = \log\left(\frac{\sum_{S+} \tilde{\alpha}_{k-1}(s') \cdot \gamma_k(s' \cdot s) \cdot \tilde{\beta}_k(s)}{\sum_{S-} \tilde{\alpha}_{k-1}(s') \cdot \gamma_k(s' \cdot s) \cdot \tilde{\beta}_k(s)}\right) \quad (3)$$

In the MAP algorithm, Viterbi decoding is performed using the trellis diagram (state transition diagram). The path connecting each state at each time point on the trellis diagram corresponds to the coded sequence to be decoded. The likelihood (path metric) for the possible path is calculated, and the path with the highest likelihood is decoded as a survival path.

The trellis diagram is described first of all. FIG. 17 is a view showing a recursive convolutional encoder for outputting recursive convolutional codes. FIG. 18 is a schematic diagram showing the state transition thereof.

In the recursive convolutional encoder, the values stored in D1 and D2 vary by input bits supplied through the input INPUT. In the recursive encoder, the output of D2 is forwarded to the input INPUT side, thereby realizing the recursive convolutional encoding. FIG. 18 shows the state transition diagram of the possible values of the D1 and D2, i.e. (00), (01), (10), and (11) In FIG. 18, 0/0 indicates input bit/output bit, for example. The values of D1 and D2 transit according to the input bits "0" or "1" through the input INPUT. For example, when (D1 D2) is (00), the convolutional encoder outputs "0" through the output OUTPUT if "0" is input through the input INPUT, and the D1 and D2 return to the state (00). If, on the other hand, "1" is input, the convolutional encoder outputs "1", and the D1 and D2 shift to the state (10).

FIG. 19 is a trellis diagram that the state transition diagram of FIG. 18 is deployed on the time base. In FIG. 19, the full-line arrow indicates the state transition of D1 and D2 when the input bit is "0", and the dotted-line arrow indicates the state transition of D1 and D2 when the input bit is "1". The horizontal axis represents the time base, and k−1 and k indicate given timings.

The process of performing Viterbi decoding in the forward direction on the trellis diagram to thereby calculate a path metric is called the forward process. The process of performing Viterbi decoding in the opposite direction from the forward process to thereby calculate a path metric is called the backward process. A path metric value which is calculated in the forward process is called a path metric, and a path metric value which is calculated in the backward process is called β path metric. γ indicates the probability of transition from a certain state (e.g. state (11)) at timing (k−1) to a certain state (e.g. state (11)) at timing k, which is called branch metric. The values α and β indicate the probability of being the relevant state (e.g. state (11)) at timings (k−1) and k. A log likelihood ratio LLR is calculated from the α path metric, the β path metric, and the branch metric (γ).

FIG. 20 is a view to describe the way of calculating the transition probability using the trellis diagram. The calculation formula for the values α and β are shown below as Expressions 4 and 5. As described above, the value γ indicates the transition probability in each state at a certain time point on the trellis. The value α, which is represented by the following Expression 4, indicates the achievement probability to each state in the forward direction (i.e. the direction from the starting point to the endpoint on the trellis diagram), and it is the summation of γ in the forward direction. The value β, which is represented by the following Expression 5, is the summation of γ in the backward direction (i.e. the direction from the endpoint to the starting point).

$$\text{Achievement probability: } \tilde{\alpha}_k(s) = \sum_{x' \in s} \tilde{\alpha}_{k-1}(s') \cdot \gamma_k(s', S) \qquad (4)$$

$$\text{Achievement probability: } \tilde{\beta}_{k-1}(s') = \sum_{x' \in s} \tilde{\alpha}_{k-1}(s) \cdot \gamma_k(s', S) \qquad (5)$$

If, for example, $\alpha_k(00)$ indicates the achievement probability in the forward direction existing in the state (00) at timing k (which is referred to hereinafter as the state $(00)_k$), $\alpha_k(00)$ is a sum of a product of $\alpha_{k-1}(00)$ and a transition probability $\gamma_k(00, 00)$ from the achievement probability $\alpha_{k-1}(00)$ in the state $(00)_{k-1}$ to the state $(00)_k$ and a product of the achievement probability $\alpha_{k-1}(01)$ in the state $(01)_{k-1}$ and a transition probability $\gamma_k(01, 00)$ from the state $(00)_{k-1}$ to the state $(00)_k$, as shown in FIG. 20 and Expression 4.

Further, if $\beta_{k-1}(00)$ indicates the achievement probability in the backward direction existing in the state (00) at timing k-1 (which is referred to hereinafter as the state $(00)_{k-1})$, $\beta_{k-1}(00)$ is a sum of a product of $\beta_{k-1}(00)$ and a transition probability $\gamma_k(00, 00)$ from the achievement probability $\beta_{k-1}(00)$ in the state $(00)_{k-1}$ to the state $(00)_k$ and a product of the achievement probability $\beta_{k-1}(01)$ in the state $(01)_{k-1}$ and a transition probability $\gamma_k(00, 10)$ from the state $(00)_{k-1}$ to the state $(10)_k$, as shown in FIG. 20 and Expression 5.

In Expressions 4 and 5, α(s) and β(s) indicate the path metric in the present state s and the previous state s', and γ(s', s) indicates the probability of state transition from s' to s.

FIG. 21 is a view to describe the way of calculating the log likelihood ratio LLR from the values α, β, and γ. As shown in FIG. 21, the multiplication of the achievement probability α in the forward direction, the achievement probability β in the backward direction, and the transition probability γ between states gives the transition probability at the relevant time point in consideration of all time points on the trellis. The product of the transition probability corresponding to the input "0" is δ0, and the product of the transition probability corresponding to the input "1" is δ1. The log ratio of δ0 and δ1, i.e. log(δ0/δ1), is the log likelihood ratio LLR represented by the above Expression 3.

The log likelihood ratio and the extrinsic information satisfy the following Expression 6. Specifically, the turbo decoding process calculates the extrinsic information by subtracting intrinsic information from both sides of Expression 6 representing the log likelihood ratio LLR.

Log Likelihood Ratio:

$$L(u_k) = L_c y_k^s + L^e(u_k) + \log\left(\frac{\sum_{S+} \tilde{\alpha}_{k-1}(s') \cdot \gamma_k^e(s' \cdot s) \cdot \tilde{\beta}_k(s)}{\sum_{S-} \tilde{\alpha}_{k-1}(s') \cdot \gamma_k^e(s' \cdot s) \cdot \tilde{\beta}_k(s)}\right) \qquad (6)$$

where
$L_c$ indicates a constant determined by a transmission line,
$y_k^s$ indicates a systematic portion,
$L^e(u_k)$ indicates previous extrinsic information (priori information),
$L_c y_k^s + L^e(u_k)$ indicates intrinsic information, and $$\log\left(\frac{\sum_{S+} \tilde{\alpha}_{k-1}(s') \cdot \gamma_k^e(s' \cdot s) \cdot \tilde{\beta}_k(s)}{\sum_{S-} \tilde{\alpha}_{k-1}(s') \cdot \gamma_k^e(s' \cdot s) \cdot \tilde{\beta}_k(s)}\right)$$

indicates extrinsic information.

Log-MAP Algorithm

The Log-MAP algorithm is described below. As described above, the MAP algorithm calculates the product of the probabilities and therefore it requires a multiplier, which causes a significant increase in circuit size. Thus, in actual applications, the Log-MAP or Max-log-MAP algorithm which approximates or simplifies the probability calculation in the MAP algorithm in a log region is employed. The approximate expressions are shown in the following Expressions 7 to 11.

$$A_k(s) = \log \tilde{\alpha}_k(s) \qquad (7)$$

$$B_k(s) = \log \tilde{\beta}_k(s) \qquad (8)$$

$$\Gamma_k(s', s) = \log \tilde{\gamma}_k(s', s) \qquad (9)$$

$$A_k(s) = \log\left(\sum_{x'} \exp(A_{k-1}(s') + \Gamma_k(s', s))\right) \qquad (10)$$

$$B_{k-1}(s) = \log\left(\sum_{x} \exp(B_k(s) + \Gamma_k(s', s))\right) \qquad (11)$$

The values α, γ, β are approximated by a log and defined as A, Γ, and B, respectively, as shown in Expressions 7 to 9 to thereby give Expressions 10 and 11 which are transformed versions of Expressions 4 and 5. However, Expressions 10 and 11 contain the items that the replacement of the calculation inside the parentheses exp. with $A_i$ results in Expression 12 below, which poses a problem in actual applications. Thus, Expression 12 is further decomposed into Expression 13 below.

$$\log\left[\sum_i \exp(A_i)\right] \qquad (12)$$

$$\log\left[\sum_i \exp(A_i)\right] = A_M + \log\left(1 + \sum_{A_i \neq A_M} \exp(-|A_i - A_M|)\right), \qquad (13)$$

$$A_M = \max_i A_i$$

In the above expressions, the value i indicates the number of paths which transit to a certain state. In the example of FIG. 20, the number of paths which transit to the state $(00)_k$ in the forward direction is 2, and $A_M$ indicates the larger one of the paths. In actuality, the calculation is performed on the basis of Expression 13. This is the Log-MAP algorithm. Particularly, a typical technique implements decoding with LUT by setting the second term of the right side of Expression 13 to log(1+ $e^{-x}$). A technique of making a further approximation with a fixed value or −ax+b is also known. The operation of log(1+ $e^{-x}$) addition is sometimes particularly called Log-sum. The item $|A_i - A_M|$ in the second term is called the path metric value.

MAX-Log-MAP Algorithm

The Max-Log-MAP algorithm is a technique that further approximates the Log-MAP algorithm which is represented by Expressions 10 and 11 above. The approximate expressions are shown as the following Expressions 14 and 15. Specifically, in the Max-Log-MAP algorithm, the Log-sum term is eliminated from the above Expressions 10 and 11. The item max( ) is the operation for selecting a maximum value, which is equivalent with ACS (Add Compare Select) operation in the Viterbi Algorithm. Therefore, this is a simple method with a lowest cost which enables the probability calculation to be performed using the Viterbi Algorithm.

$$A_k(s) = \log\left(\sum_{s'} \exp\{A_{k-1}(s') + \Gamma_k(s', S)\}\right) \quad (14)$$
$$\approx \max_i (A_{k-1}(s') + \Gamma_k(s', s))$$

$$B_{k-1}(s) = \log\left(\sum_{s} \exp\{B_k(s) + \Gamma_k(s', S)\}\right) \quad (15)$$
$$\approx \max_i (B_k(s) + \Gamma_k(s', s))$$

As described above, the probability calculation in the Log-MAP algorithm is equivalent to making a correction with Log-sum (referred to hereinafter as the Jacobian correction factor) to the ACS operation in the Viterbi Algorithm. FIG. 22 schematically shows a circuit for performing the probability calculation using the Log-MAP algorithm. As shown in FIG. 22, a circuit 301 for performing the calculation as represented by Expression 13 includes an ACS circuit 302 that compares input values to select and output the larger one and a Log-Sum circuit 303 that obtains the Jacobian correction factor and calculates a sum with the operation results of the ACS circuit 302.

The ACS circuit 302 receives two $A_i$, which are referred to hereinafter as input I1 and input I2. The ACS circuit 302 includes an adder 311 that adds the input I1 and an inverted value of the input I2, a selector 312, and an absolute value circuit 313. The adder 311 adds the input I1 and an inverted value of the input I2, determines which value of the inputs I1 and I2 is larger according to the result being positive or negative, and supplies the determination result to the selector 312. According to the determination result, the selector 312 selects and outputs the larger one ($=A_M$) of the inputs I1 and I2. The absolute value circuit 313 outputs an absolute value of the result of the adder 311, which is a difference between the inputs I1 and I2. This value is the path metric value $|A_i-A_M|$ in the above Expression 13.

The Log-Sum circuit 303 calculates $\log(1+e^{\wedge}(-|A_i-A_M|))$ based on the above value. The calculation of the correction factor may be performed using the approximate expression with a fixed value or $-ax+b$, or using LUT with $\log(1+e^{-x})$. After that, an adder 321 adds the obtained result and the output $A_M$ from the ACS circuit 302 and outputs the result s.

The above techniques, however, require the implementation of LUT or the implementation of a circuit for multiplication and addition contained in the approximate expression, which causes an increase in circuit size and data path delay. If a Log-sum correction factor can be calculated using a simple circuit with the bit operation of x only without implementing LUT or a multiplication/addition circuit, the provision of a decoding device with a smaller circuit and less delay would be enabled.

SUMMARY OF THE INVENTION

According to an aspect of the present invention, there is provided an arithmetic circuit for correcting an approximate value computed by Max-Log-MAP algorithm based on Log-MAP algorithm, which includes a first logic circuit outputting 1-bit inverted logical OR from all of a first bit group containing 1 or more high-order bit of a path metric value composed of a plurality of bits, a second logic circuit inverting each bit of a second bit group containing 1 or more high-order bit of a remainder of the path metric value composed of the plurality of bits excluding the first bit group and outputting a third bit group, a third logic circuit outputting a fourth bit group containing results of calculating a logical AND of an output of the first logic circuit and each bit of the third bit group, and a correction factor output section outputting a correction factor based on the fourth bit group.

The aspect of the present invention obtains a correction factor in Log-MAP algorithm by bit operation of a path metric value (path metric difference: PMD) to thereby reduce a circuit size and suppress a data path delay.

According to another aspect of the present invention, there is provided an arithmetic circuit for correcting an approximate value computed by Max-Log-MAP algorithm based on Log-MAP algorithm, which includes a maximum value output circuit outputting a maximum value in Max-Log-MAP algorithm, and a correction circuit correcting the maximum value. The correction circuit includes a mask value generator calculating a mask value based on a path metric value composed of a plurality of bits, a mask processor performing mask processing on the path metric value based on the mask value, and a logic circuit calculating a logical OR of the maximum value and an output of the mask processor.

The aspect of the present invention performs an addition of a correction factor in Log-MAP algorithm by the calculation of a mask value by bit operation of a path metric value and the mask processing to thereby reduce a circuit size and suppress a data path delay.

The present invention enables the reduction of a circuit size and the suppression of a data path delay in an arithmetic circuit for correcting an approximate value computed by Max-Log-MAP algorithm based on Log-MAP algorithm.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary embodiments of the present invention are described hereinafter in detail with reference to the drawings. An arithmetic circuit according to an embodiment of the invention is used in a soft-output decoding section for calculating extrinsic information or a log likelihood ratio in a turbo decoding device. The arithmetic circuit operates to calculate a Jacobian correction factor in the Log-MAP algorithm for correcting an approximate value obtained in the MAX-Log-MAP algorithm or to correct an approximate value obtained in the MAX-Log-MAP algorithm.

First Embodiment

Figure 1:
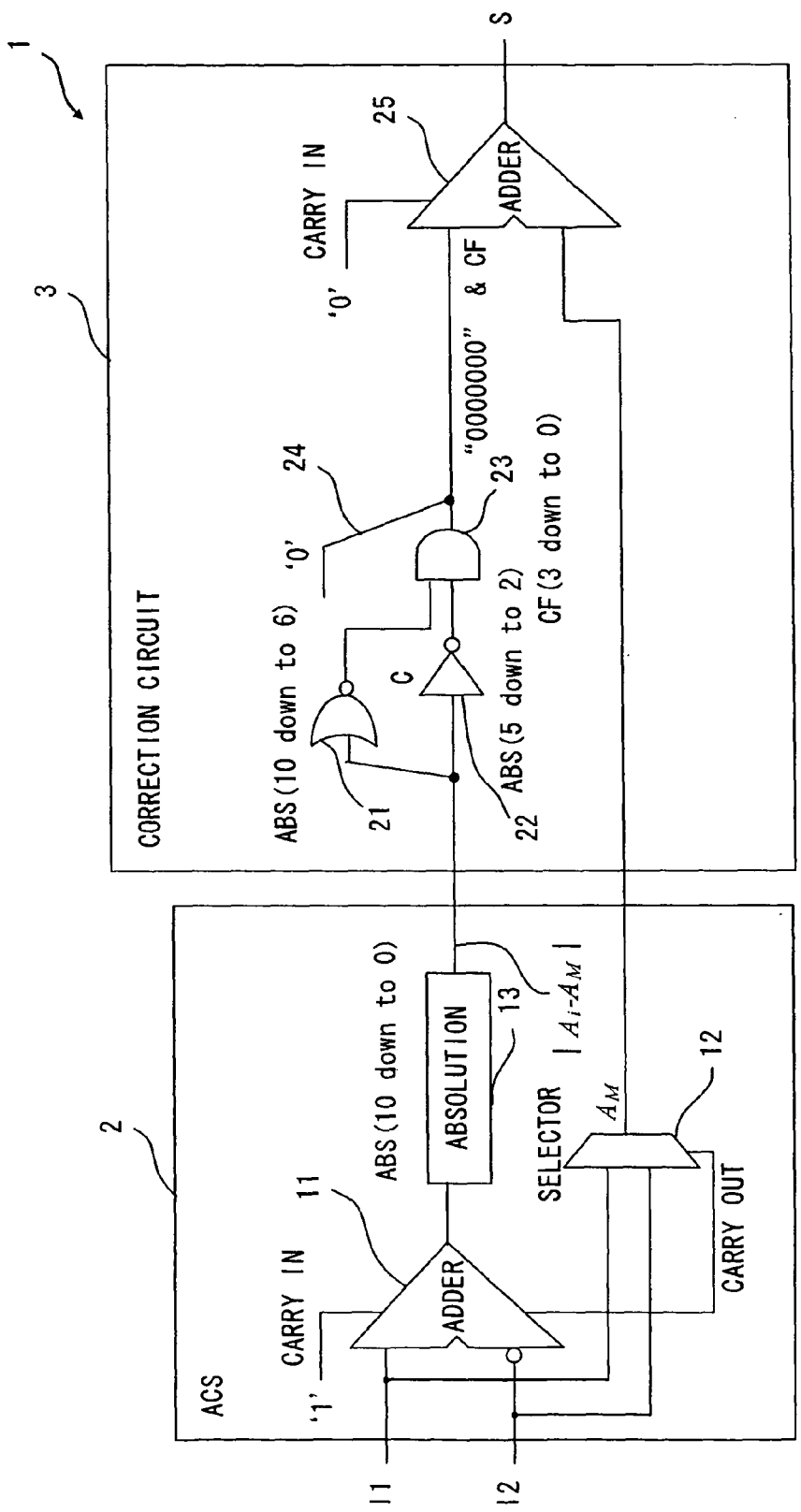
FIG. 1 is a view showing an arithmetic circuit according to a first embodiment of the invention.
Figure 16:
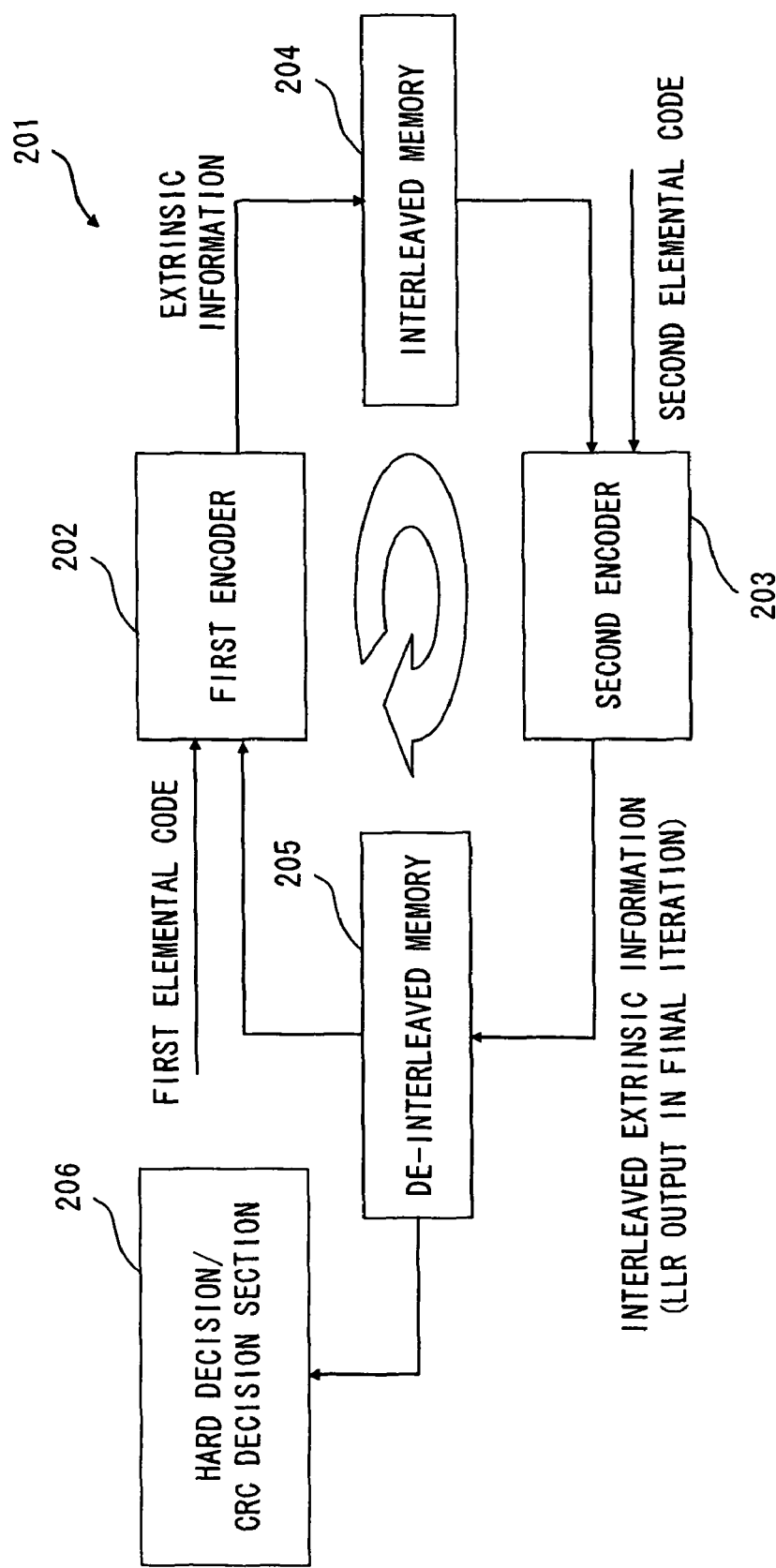
FIG. 16 is a view showing a typical decoding device for turbo decoding.
Figure 17:
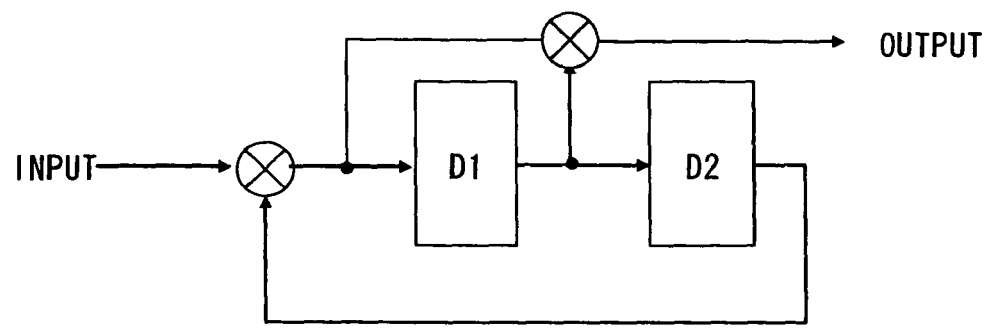
FIG. 17 is a view showing a recursive convolutional encoder for outputting recursive convolutional codes.
Figure 18:
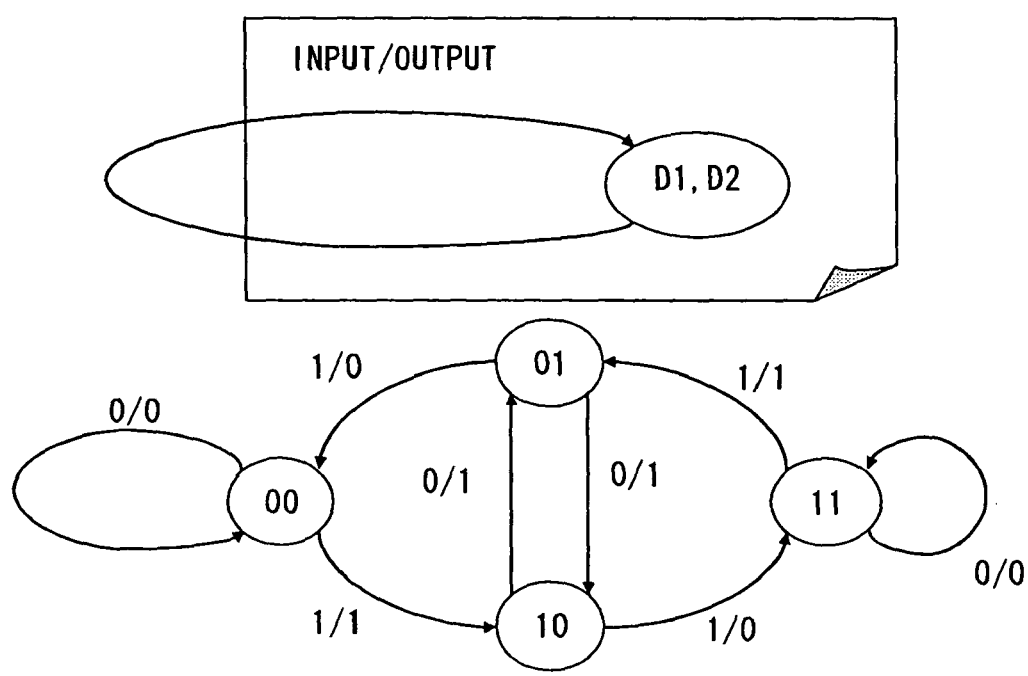
FIG. 18 is a schematic view showing the state transition of recursive convolutional codes shown in FIG. 17.
Figure 19:
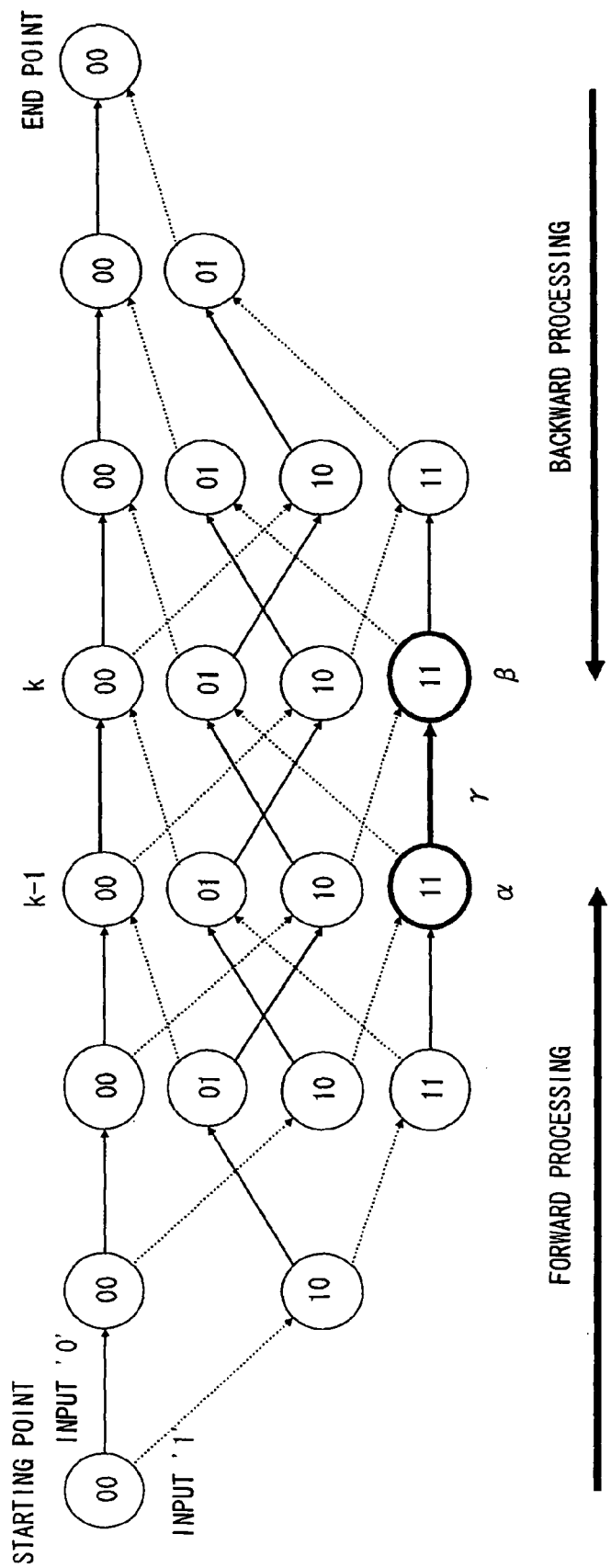
FIG. 19 is a view showing a trellis diagram.
Figure 20:
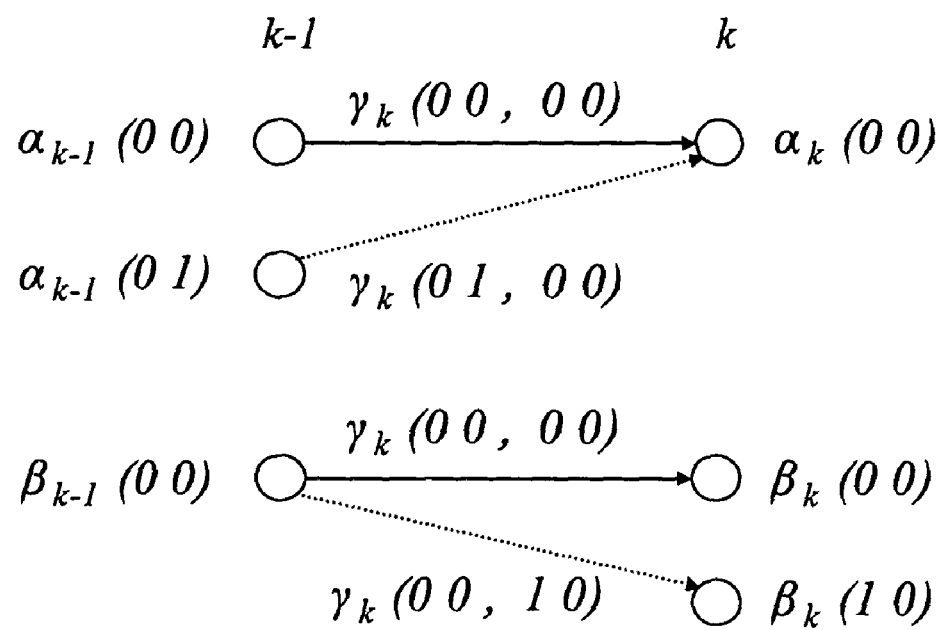
FIG. 20 is a view to describe a way of obtaining a transition probability using a trellis diagram.
Figure 21:
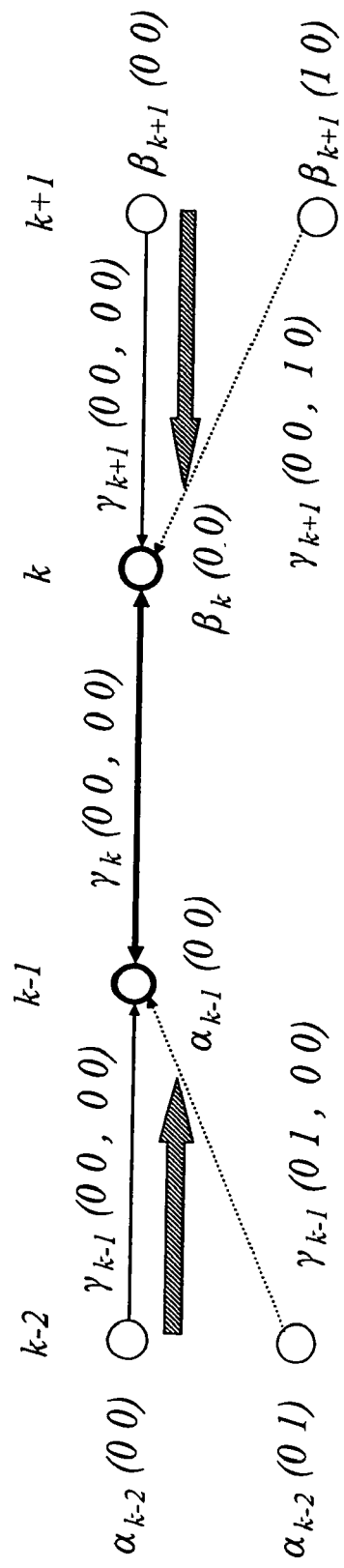
FIG. 21 is a view to describe a way of calculating a log likelihood ratio LLR from probabilities α, β, and γ.
Figure 22:
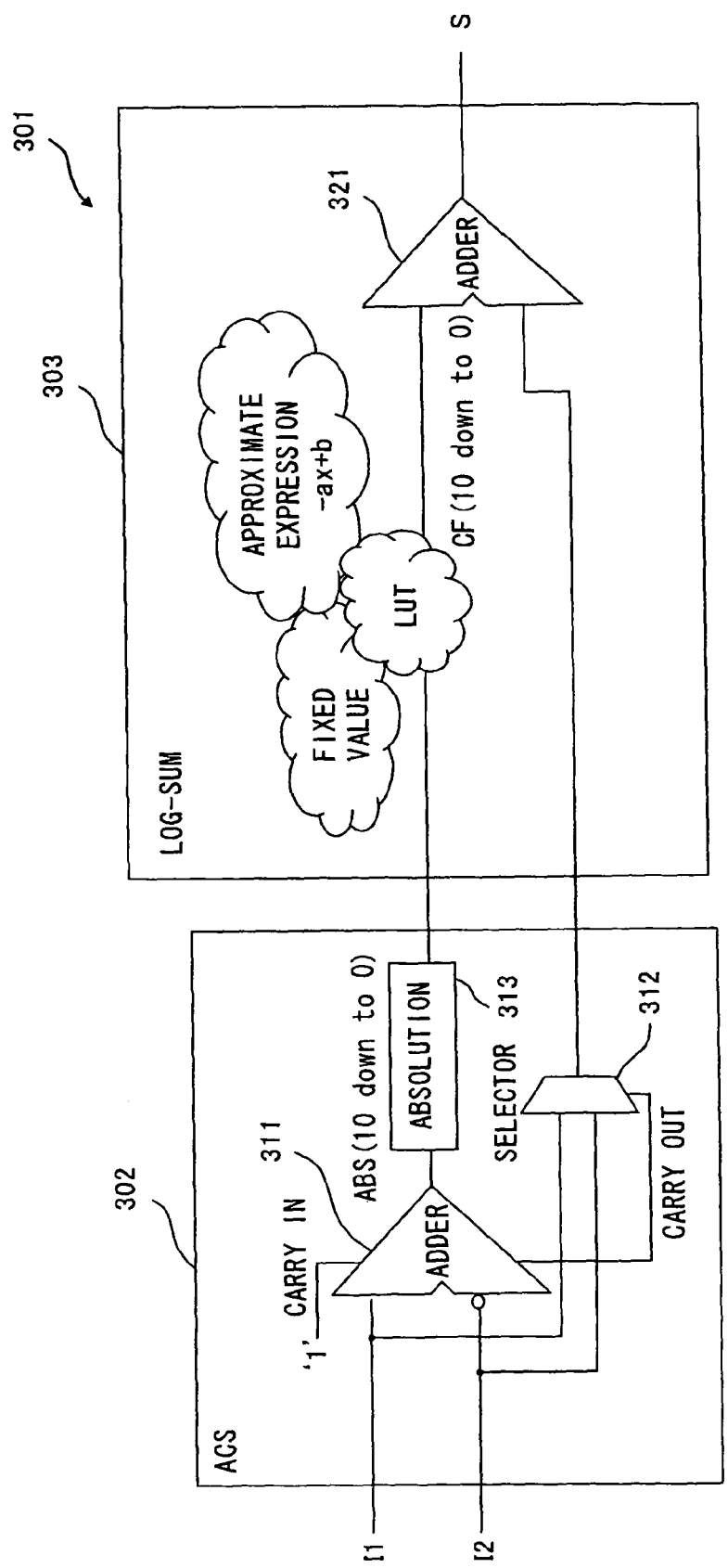
FIG. 22 is a schematic view showing a circuit for probability calculation in the conventional Log-MAP algorithm.

FIG. 1 is a view showing an arithmetic circuit according to a first embodiment of the present invention. The arithmetic circuit of this embodiment may be disposed in the decoders 202 and 203 in the decoding device 201 for decoding turbo codes as shown in FIG. 16 described above. The decoders 202 and 203 calculate the log likelihood ratio as represented by the following Expression 16.

Log Likelihood Ratio:

$$L(u_k) = L_c y_k^s + L^e(u_k) + \log\left(\frac{\sum_{S+} \tilde{\alpha}_{k-1}(s') \cdot \gamma_k^e(s' \cdot s) \cdot \tilde{\beta}_k(s)}{\sum_{S-} \tilde{\alpha}_{k-1}(s') \cdot \gamma_k^e(s' \cdot s) \cdot \tilde{\beta}_k(s)}\right) \quad (16)$$

where
$L_c$ indicates a constant determined by a transmission line,
$y_k^s$ indicates a systematic portion,
$L^e(u_k)$ indicates previous extrinsic information (priori information),
$L_c y_k^s + L^e(u_k)$ indicates intrinsic information, and $$\log\left(\frac{\sum_{S+} \tilde{\alpha}_{k-1}(s') \cdot \gamma_k^e(s' \cdot s) \cdot \tilde{\beta}_k(s)}{\sum_{S-} \tilde{\alpha}_{k-1}(s') \cdot \gamma_k^e(s' \cdot s) \cdot \tilde{\beta}_k(s)}\right)$$

indicates extrinsic information.

The extrinsic information is calculated from the log likelihood ratio and exchanged between the decoders 202 and 203 for iterative operation, thereby decoding received data. In order to obtain the log likelihood ratio, Expressions 19 and 20 which are approximated by Expressions 17 and 18 are obtained. The arithmetic circuit according to this embodiment is a circuit for obtaining Expressions 19 and 20.

$$A_k(s) = \log \tilde{\alpha}_k(s) \quad (17)$$

$$B_k(s) = \log \tilde{\beta}_k(s) \quad (18)$$

$$A_k(s) = \log\left(\sum_{x'} \exp(A_{k-1}(s') + \Gamma_k(s', s))\right) \quad (19)$$

$$B_{k-1}(s) = \log\left(\sum_{x'} \exp(B_k(s) + \Gamma_k(s', s))\right) \quad (20)$$

Expression 19, for example, can be approximated as the following Expression 21.

$$A_k(s) = \log\left(\sum_{x'} \exp(A_{k-1}(s') + \Gamma_k(s', s))\right) \quad (21)$$
$$= \log\left[\sum_i \exp(A_i)\right]$$
$$= A_M + \log\left(1 + \sum_{A_i \neq A_M} \exp(-|A_i - A_M|)\right),$$

$$A_M = \max_i A_i$$

Specifically, the arithmetic circuit 1 receives $A_i$ which is a logarithmically approximated value of an achievement probability at one time point on trellis and obtains $A_k(s)$ or $B_{k-1}(s)$. Although the input $A_i$ is described as $A_1$ (=I1) and $A_2$ (=I2) in this example, it may be two or more values.

The arithmetic circuit 1 includes an ACS circuit 2 and a correction circuit 3. The ACS circuit 2 determines a maximum value $A_M$ from inputs I1 and I2. The correction circuit 3 receives a path metric value $|A_i - A_M|$ from the ACS circuit 2. The correction circuit 3 then obtains a Jacobian correction factor from the path metric value and adds the correction factor to the maximum value $A_M$ to thereby correct the maximum value $A_M$. The maximum value $A_M$ is an approximate value (maximum value) that is computed by the Max-Log-MAP algorithm. The correction circuit 3 adds the obtained correction factor and the maximum value $A_M$ obtained by the ACS circuit 2 and outputs $A_k(s)$ or $B_{k-1}(s)$ as represented by Expression 19 or 20.

The ACS circuit 2 includes an adder 11, a selector 12, and an absolute value circuit 13. The adder 11 receives the input I1 and an inverted input of the input 12 and outputs a carry out according to their magnitude relation. Specifically, if I1<I2, a difference between I1 and I2 is negative(−) and the carry out is output to the selector 12. The selector 12 also receives the inputs I1 and I2 and selects and outputs the larger value based on the carry out. The output value corresponds to the value $A_M$ in Expression 19. The output of the adder 11, which is I1−I2, is supplied to the absolute value circuit 13, and an absolute value |I1−I2|(=|$A_t$−$A_M$|) is supplied to the correction circuit 3.

Although 11-bit data is supplied as I1 and I2 in this embodiment, the data is not limited to 11 bits, and it may be smaller or larger bits. In the following description, each bit is represented by x(10), x(9), . . . , x(0) from MSB, and expressed as the first bit x(0), the second bit x(1), and so on. Although the input is described as two inputs I1 and I2 in this embodiment, the input may be three or more.

The correction circuit 3 includes a NOR circuit 21 as a first logic circuit, an inverter 22 as a second logic circuit, an AND circuit 23 as a third logic circuit, a CF output section 24 as a correction factor output section, and an adder 25. In this embodiment, the NOR circuit 21 outputs 1-bit inverted logical OR which is calculated from all of 5 high-order bits (x(10) to x(6)) as a first bit group of the 11-bit input data. The inverter 22 inverts each bit of the third bit x(2) to the sixth bit x(5) as a second bit group and outputs them as a third bit group. The AND circuit 23 calculates the logical AND of the output from the NOR circuit 21 and the output from each inverter 22 and outputs the results as a fourth bit group. Then, the CF output section 24 supplies correction bits CF(0) to CF(10) (correction value CF) of a total 11 bits, composed of 4 low-order bits of 4 output bits from the AND circuit 23 and 7 high-order bits of 0 data, to the adder 25. The adder 25 receives the maximum value $A_M$ from the ACS circuit 2, adds the maximum value $A_M$ and the correction value CF, and outputs the result as a log likelihood ratio LLR (s).

Figure 2:
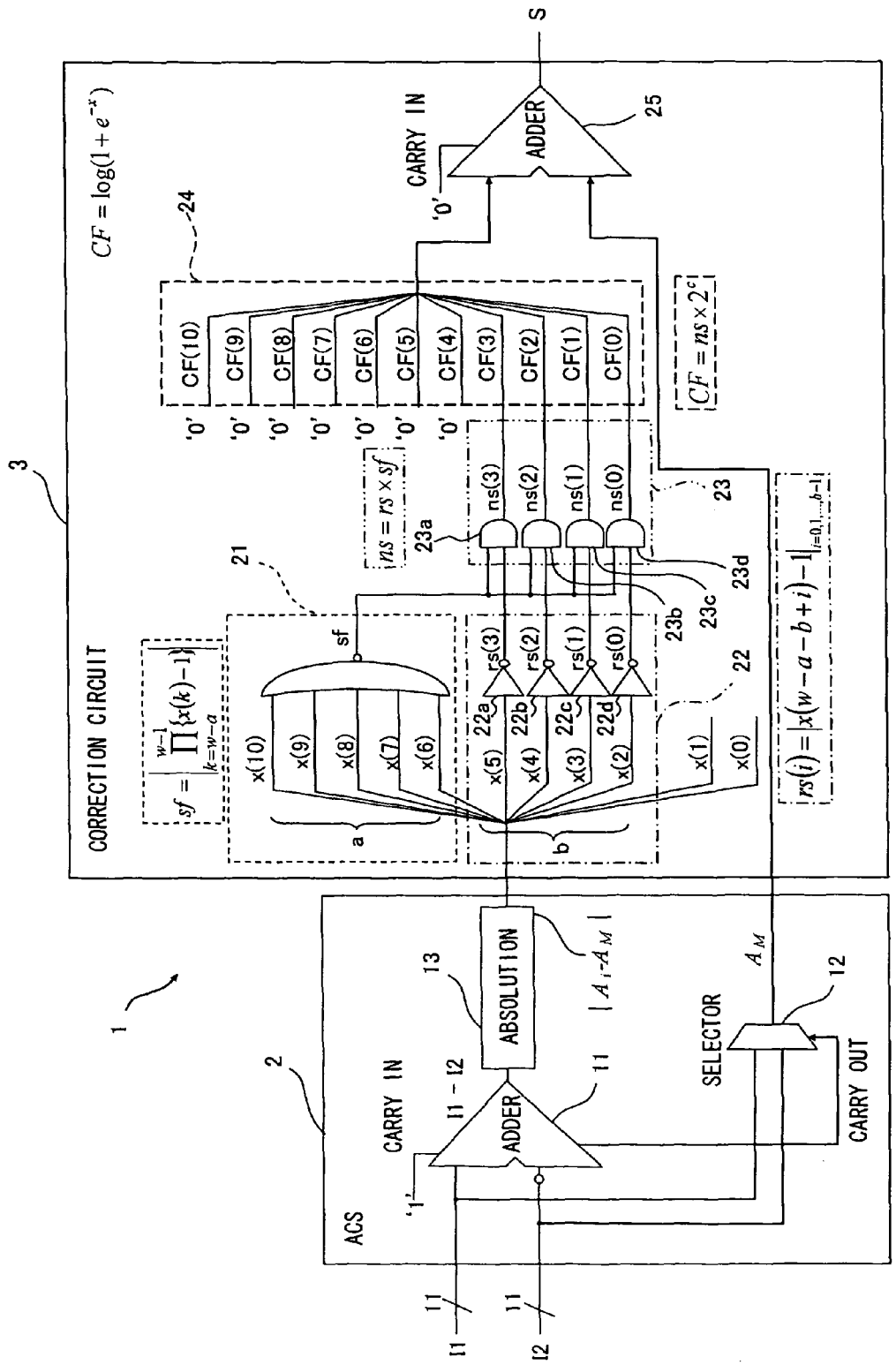
FIG. 2 is a circuit diagram showing a detailed example of the arithmetic circuit according to the first embodiment of the invention.

FIG. 2 shows a detail of the arithmetic circuit shown in FIG. 1. In the correction circuit 3, the bit width of the input |I1−I2| (path metric value=|$A_t$−$A_M$|) is w, each bit of the input is x(j) (0≦j≦w−1), the bit width of a bit group input to the NOR circuit 21 is a (1≦a≦w−1), and the bit width of a bit group input to the inverter 22 is b (1≦b≦w−a−1), and the parameter for defining the relationship between the bit group output from the AND circuit 23 and the CF output section 24 is c (−(w−1)≦c≦w−1). The output sf from the NOR circuit 21, the output bit rs (i) from each inverter 22a to 22d, the value ns indicated by the output bit of each AND circuit 23a to 23d, and the value CF output from the CF output section 24 respectively satisfy the following Expressions 22 to 25.

$$sf = \left| \prod_{k=w-a}^{w-1} \{x(k) - 1\} \right| \quad (22)$$

$$rs(i) = |x(w - a - b + i) - 1|_{i=0,\ldots,b-1} \quad (23)$$

$$ns = rs \times sf \quad (24)$$

$$CF = ns \times 2^c \quad (25)$$

In this embodiment, the case where a=5, b=4 and c=0 is described by way of illustration. As described later, changing the parameters a, b, and c enables the obtainment of a desired correction value CF. As shown in FIG. 2, in the correction circuit 3, the NOR circuit 21 calculates an inverted logical OR sf of x(6) to x(10). The inverter 22 includes inverters 22a to 22d that respectively output inverted values of x(5) to x(2) as rs(3) to rs(0). The AND circuit 23 includes AND circuits 23a to 23d that respectively output logical AND of the inverted logical OR sf and rs(3) to rs(0) as ns(3) to ns(0). The CF output section 24 outputs 11 bits from CF(0) to CF(10). Because the parameter c, which is described later, is 0 in this embodiment, the CF output section 24 outputs CF(0) to CF(3) as ns(0) to ns(3). The high-order bits above CF(4) are all 0. The outputs CF are added with the output $A_M$ from the selector 12 in the adder 25 to thereby obtain an output s.

Figure 3:
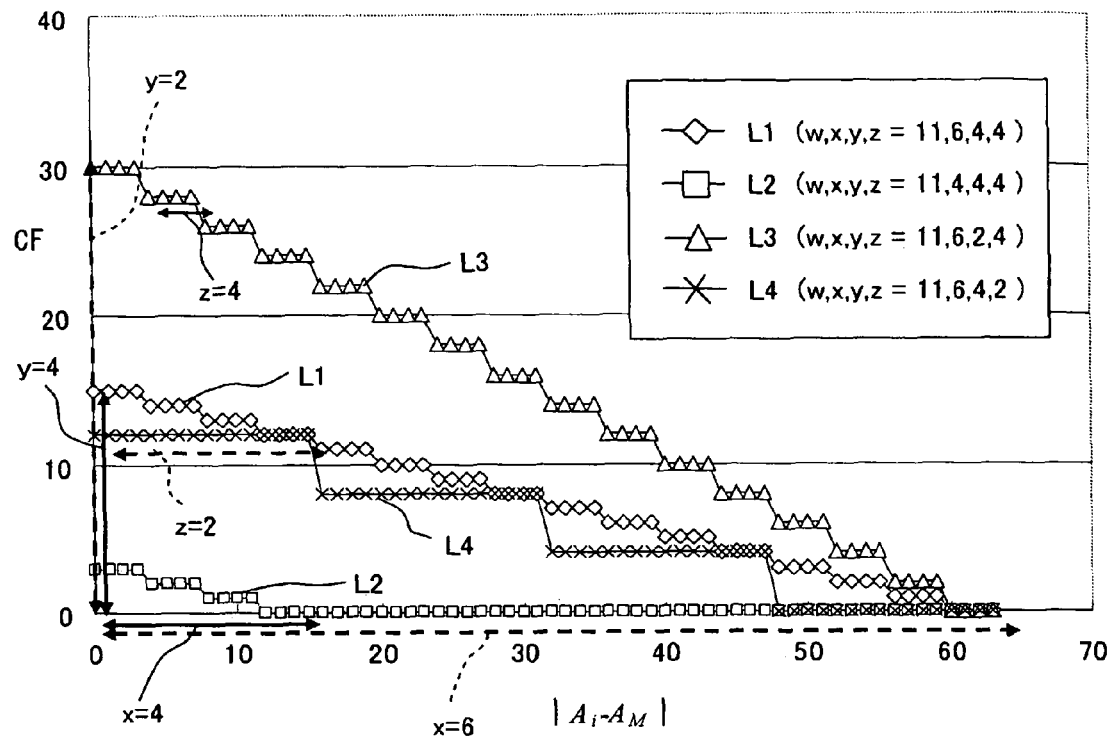
FIG. 3 is a graph showing an output CF of a CF output section which is obtained in a correction circuit according to the first embodiment of the invention.

The parameters a, b, and c in the above Expressions 22 to 25 are described in detail hereinafter. FIG. 3 is a graph showing the outputs CF of the CF output section 24 which are obtained in the correction circuit 3. FIG. 3 shows the output results CF (which is referred to hereinafter as the correction curve) of the CF output section 24 when the parameters a, b, and c are varied. In FIG. 3, the correction curves L1 to L4 indicate the values of the parameters x, y and z as cf_x_y_z. The parameter a=w−x, the parameter b=z, and the parameter c=2−$\log_2$ (y). Generally, the correction curve is a step-like curve. In the first embodiment shown in FIG. 2, w=11, a=5, b=4 and c=0, thus (x, y, z)=(w−a, $2^{2-c}$, b)=(6, 4, 4), which exhibits the correction curve L1 in FIG. 3. If the number of bits a which are input to the NOR circuit 21, i.e. the parameter x, is changed, the output of the CF output section 24 is such that the size of the steps changes exponentially as indicated by L1 and L2. Specifically, the overall width and height of the steps when the parameter x=6 are about four times greater than those of the steps when the parameter x=4.

rs(i) indicates the operation for making the slope of the correction line shown in FIG. 3 negative, which is performed from the least significant bit to a given bit x which is lower than the high-order bit used for sf. If the number of bits b for obtaining rs(i), i.e. the parameter z, is changed, the width (resolution) of each step changes as indicated by L1 and L4. The width (accuracy) corresponds to 4 bits in L1 with z=4, and 2 bits in L4 with z=2.

The output value ns of the AND circuit 23 is the operation for setting the output ns to 0 when x is a certain value or higher in FIG. 3. In FIG. 3, if the value of x is 60 or higher, the output becomes all 0. If the parameter c for determining to which bit of CF(j) the output bits ns(0) to ns(3) of the AND circuit 23 correspond, i.e. the parameter y, is changed, the height of the steps changes while the number of the steps remains unchanged as indicated by L1 and L3. The height is 1 at y=4, and it is 2 at y=2.

In this example, c=0, and ns(0) to ns(3) correspond to CF(0) to CF(3), respectively. For example, if c=2, ns(0) to ns(3)=CF(2) to CF(5) and, if c=−2, ns(2) to ns(3)=CF(0) to CF(1). The parameter c indicates the shift amount of ns(i) from the least significant bit CF(0). The values of CFs that do not correspond to any ns bit are all set to 0.

The parameters a, b and c may be set arbitrarily according to the shape of a correction line to be obtained. For example, increasing the resolution (the number of steps) of the step-like correction line enables approximation to log(1+e^(−x)). If the correction is made in stages using LUT, the arithmetic circuit of this embodiment becomes more advantageous than LUT in terms of a circuit size as the number of steps is larger. This is because, in LUT, a memory capacity for storing a table increases as the number of steps is larger, and the circuit size of a selector for comparing and selecting an appropriate range also increases accordingly.

In this way, the shape of the correction curve can be changed as needed by varying the parameters a, b and c, i.e., (x, y, z)=(w−a, $2^{2-c}$, b). Because the output CF of the CF output section 24 is the Jacobian correction factor to be added to the value $A_M$, it is preferred to select the parameters a, b and c appropriately so that it is close to the line indicating the true Jacobian correction factor.

Figure 4:
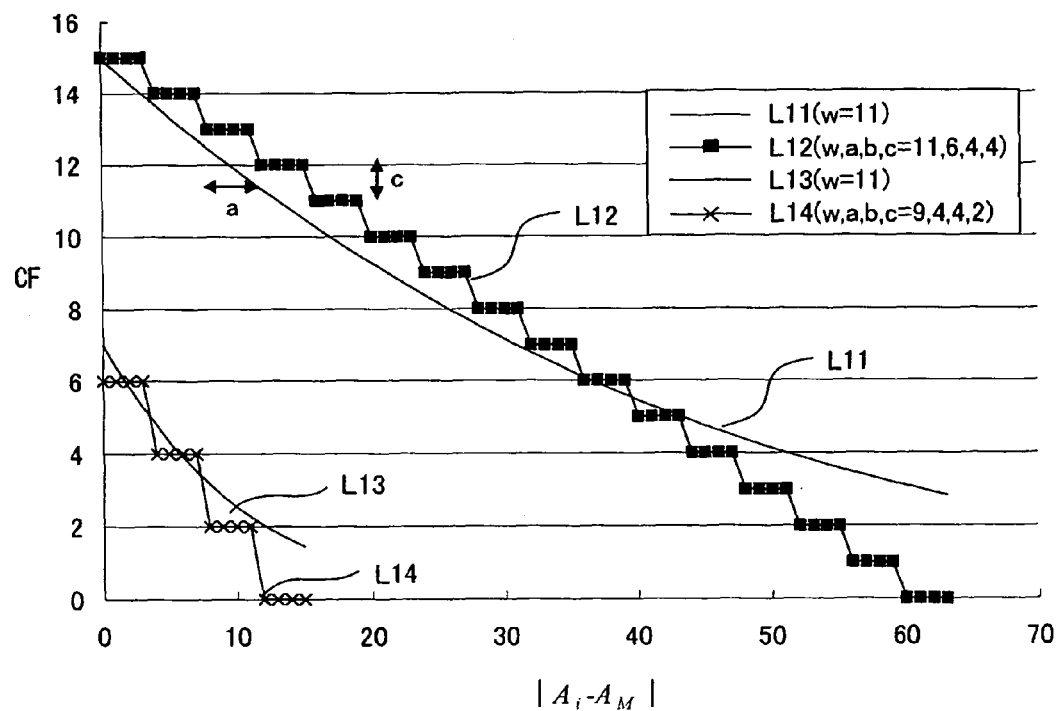
FIG. 4 is a view showing a CF (correction curve) and a true Jacobian correction factor (ideal curve) in comparison with each other.

FIG. 4 is a view showing the CF (correction curve) L12 and the true Jacobian correction factor (ideal curve) L11 in comparison with each other. If the parameters a, b and c are appropriate values, the CF (correction curve) L12 which is substantially along the ideal curve L11 can be obtained. FIG. 4 also shows the correction curve L14 and the ideal curve L13 when the bit width w=9.

Figure 5:
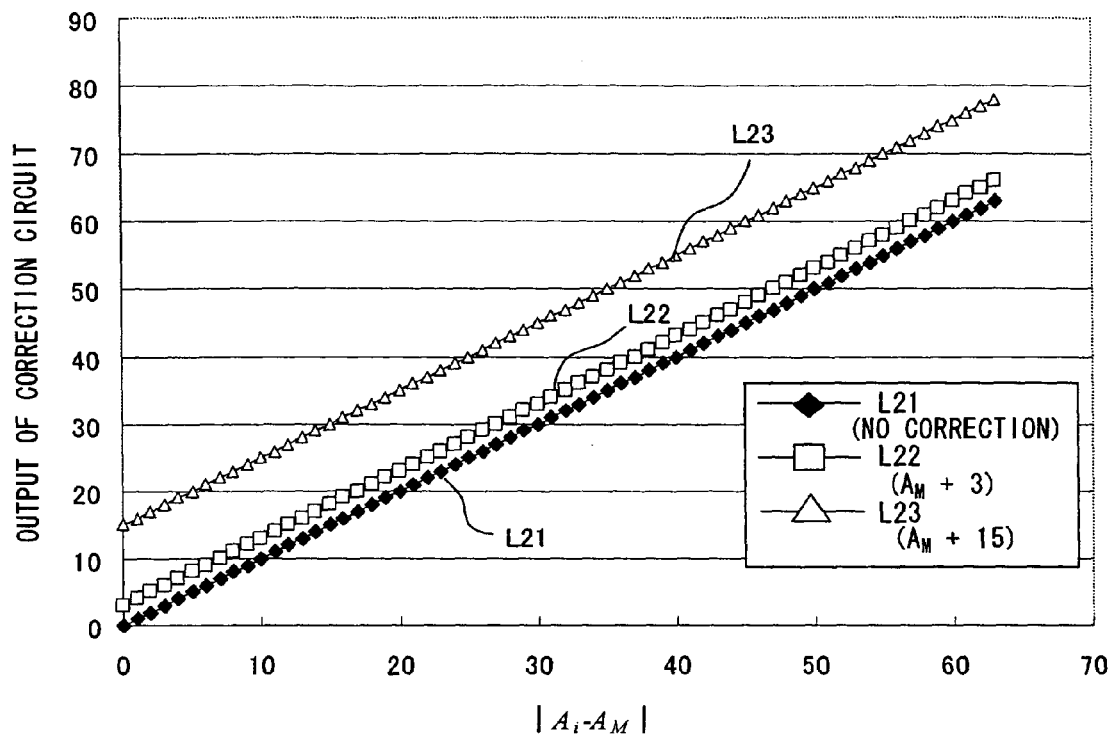
FIG. 5 is a graph showing the output sofa correction circuit when a CF is fixed and a maximum value $A_M$ is variable.
Figure 6:
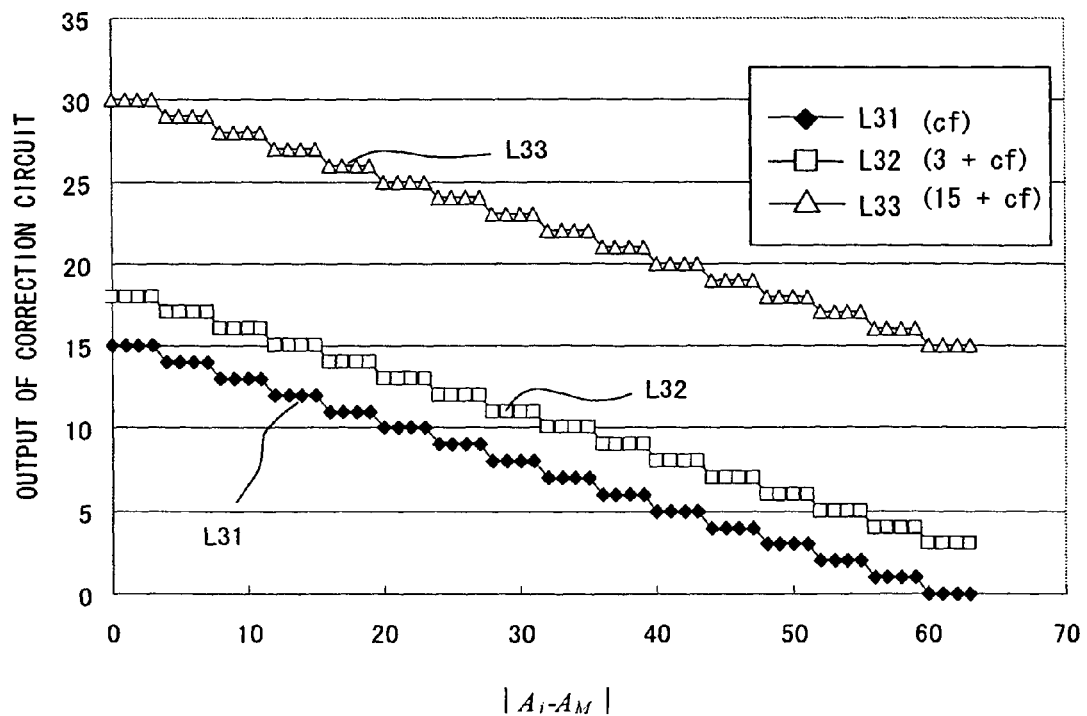
FIG. 6 is a graph showing the outputs of a correction circuit when a CF is variable and a maximum value $A_M$ is fixed.

The output of the adder 25 shown in FIG. 2 is a sum of the CF value as shown in FIGS. 3 and 4 and the maximum value $A_M$. FIG. 5 is the graph showing the output s of the correction circuit 3 when the CF is a fixed value and the maximum value $A_M$ is a variable value. FIG. 6 is the graph showing the output s of the correction circuit 3 when the CF is a variable value and the maximum value $A_M$ is a fixed value.

In FIG. 5, the curve L21 indicates the output s of the correction circuit 3 when no correction is made, and the curves L22 and L23 indicate the output s when CF=3 and 15, respectively. In FIG. 6, the curve L31 indicates the output s of the correction circuit 3 when the maximum value $A_M$=0, and the curves L32 and L33 indicate the output s when the maximum value $A_M$=3 and 15, respectively. In practice, both of the CF and the maximum value $A_M$ change, and therefore the output s of the correction circuit 3 is a value which changes three-dimensionally in combination of those.

Although the arithmetic circuit that calculates the maximum value of the inputs I1 and I2 and adds the correction factor thereto is described in this embodiment, it is possible to calculate the minimum value of the inputs I1 and I2 and subtract the correction factor therefrom. In such a case, all the bits of the CF values other than those corresponding to the ns bits are set to "1", and one input of the adder 25 is changed to an inverting input in the correction circuit 3.

In this embodiment, by appropriately setting the input bit width a to the NOR circuit 21, the bit width b inverted by the inverter 22, and the parameter c for determining the connection of ns(0) to ns(3) to CF(0) to CF(10), an approximate value of the Jacobian correction factor log(1+e^(−x)) can be obtained with bit operation only, thereby enabling the obtainment of $A_k(s)$ and $B_{k-1}(s)$ accurately without increasing the circuit size.

Second Embodiment

A second embodiment of the present invention is described hereinafter. According to the first embodiment, the arithmetic circuit calculates and adds a correction factor, and the correction circuit includes an adder. On the other hand, an arithmetic circuit of this embodiment provides further reduction of a circuit size.

Figure 7:
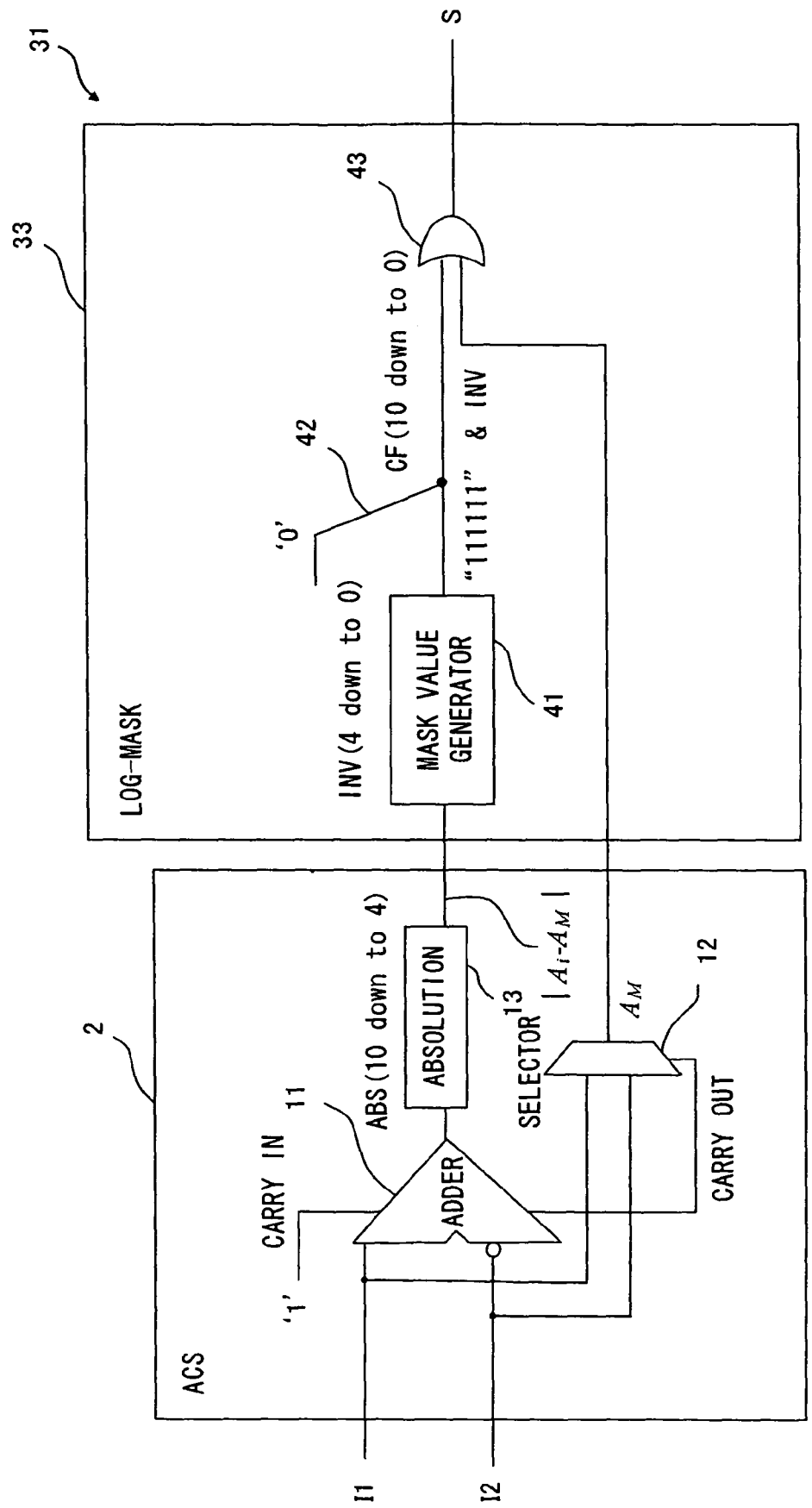
FIG. 7 is a view showing an arithmetic circuit according to a second embodiment of the invention.
Figure 8:
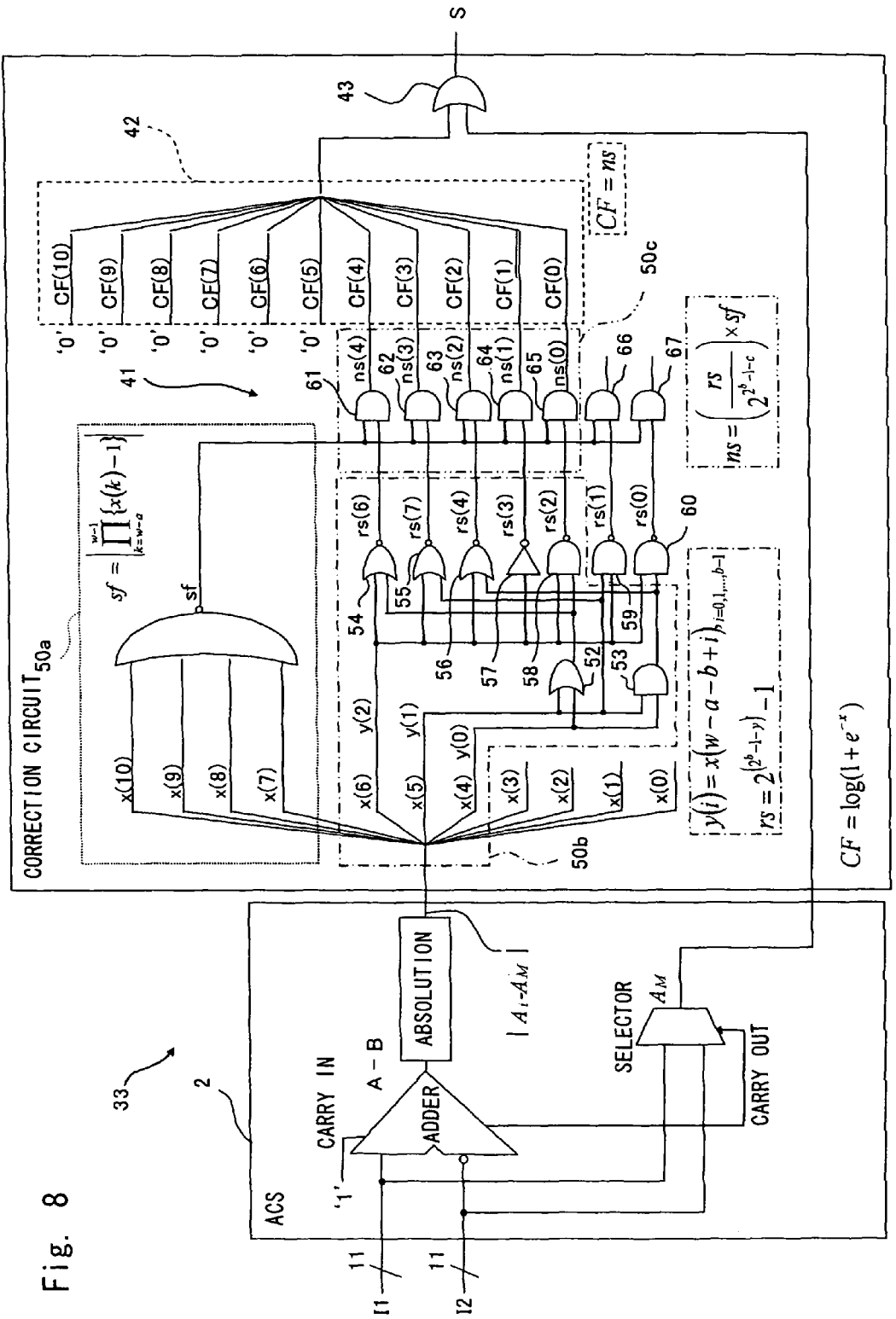
FIG. 8 is a circuit diagram showing a detailed example of the arithmetic circuit according to the second embodiment of the invention.

FIG. 7 shows an arithmetic circuit according to the second embodiment, and FIG. 8 shows a detail of the arithmetic circuit. In the second embodiment shown in FIGS. 7 and 8, the same elements as in the first embodiment are denoted by the same reference symbols and not described in detail herein.

As shown in FIG. 7, a correction circuit 33 of this embodiment includes a mask value generator 41, a CF output section 42 as a mask processor, and an OR circuit 43. The mask value generator 41 determines several low-order bits of the output from the ACS circuit 2 to serve as mask values. The CF output section 42 performs mask processing based on the output from the mask value generator 41 and outputs correction values CF(0) to CF(10). The OR circuit 43 calculates the logical OR of the correction values CF(0) to CF(10) and the output from the ACS circuit 2.

As shown in FIG. 8, the mask value generator 41 includes a NOR circuit 50a as a first logic circuit, a logic circuit 50b as a second logic circuit, and an AND circuit 50c as a third logic circuit.

The NOR circuit 50a calculates an inverted logical OR sf of a bit group (first bit group) with the bit width a. In this example, the bit width is a=4, and four high-order bits (x(7) to x(10)) of the input bits are used to calculate the inverted logical OR sf.

The logic circuit 50b calculates rs(0) to rs(6) as a third bit group based on the bit group with the bit width b. In this example, the bit width is b=3, and three bits (x(4) to x(6)) are used to calculate the third bit group rs(O) to rs(6).

If x(6) to x(4)=y(2) to y(0), the logic circuit 50b includes an AND circuit 53 for calculating a logical AND of y(0) and y(1) and an OR circuit 52 for calculating a logical OR of y(0) and y(1). The logic circuit 50b further includes NOR circuits 54 to 56, an inverter 57, and inverting AND circuits 58 to 60. The NOR circuit 54 calculates a logical NOR of y(2) and the output of the OR circuit 52 and outputs rs(6). The NOR circuit 55 calculates a logical NOR of y(2) and y(1) and outputs rs(5). The NOR circuit 56 calculates a logical NOR of y(2) and the output of the AND circuit 53 and outputs rs(4). The inverter 57 calculates an inverted value of y(2) and outputs rs(3). The inverting AND circuit 58 calculates a logical AND of y(2) and the output of the OR circuit 52 and outputs rs(2). The inverting AND circuit 59 calculates a logical AND of y(2) and y(1) and outputs rs(1). The inverting AND circuit 60 calculates a logical AND of y(2) and the output of the AND circuit 53 and outputs rs(0).

The AND circuit 50c calculates a logical AND of sf and each rs as a mask value. The AND circuit 50c includes AND circuits 61 to 67. In this embodiment, the AND circuits 61 to 65 respectively calculate the logical AND of rs(6) to rs(2) with sf and outputs ns (4) to ns (0). The AND circuits 66 and 67 are not used in this embodiment. The CF output section 42 outputs ns(4) to ns(0) respectively as CF(4) to CF(0). The other CFs to which no ns bit is supplied are all output as 0.

The bit width of the input (path metric value) to the correction circuit 33 is w, each bit of the input is x(j) (0≦j≦w−1), the bit width of a bit group input to the NOR circuit 50a is a (1≦a≦w−1), the bit width to be y(i) is b (1≦b≦w−a−1), and the parameter for defining the relationship between the mask value and CF(j) is c(−(w−1)≦c≦w−1). The output sf from the NOR circuit 50a, y(i), the output value rs from the logic circuit 50b, the mask value ns, and CF respectively satisfy the following Expressions 26 to 30.

$$sf = \left| \prod_{k=w-a}^{w-1} \{x(k) - 1\} \right| \quad (26)$$

$$y(i) = |x(w - a - b + i) - 1|_{i=0,\ldots,b-1} \quad (27)$$

$$rs = 2^{(2^b - 1 - y)} - 1 \quad (28)$$

$$ns = \left( \frac{rs}{2^{2^b - 1 - c}} \right) \times sf \quad (29)$$

$$CF = ns \quad (30)$$

Figure 9:
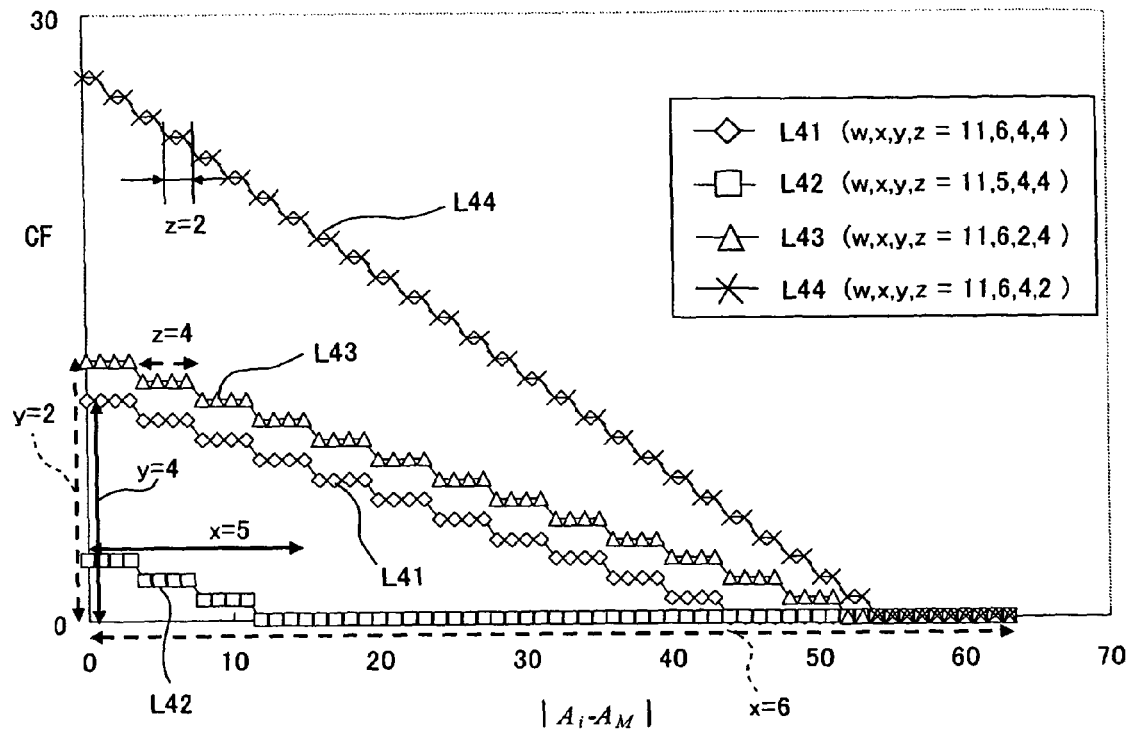
FIG. 9 is a graph showing an output CF of a CF output section which is obtained in a correction circuit according to the second embodiment of the invention.

The parameters a, b, and c in the above Expressions 26 to 30 are described in detail hereinafter. FIG. 9 is a graph showing the outputs CF of the CF output section 42 which are obtained in the correction circuit 33. FIG. 9 shows the output results (correction curve) of the CF output section 42 when the parameters a, b, and c are varied. In FIG. 9, like FIG. 3, the correction curves L41 to L44 indicate the values of the parameters x, y and z as cf_x_y_z. The parameter a=w-x, the parameter b=z, and the parameter c=$\log_2$(y), and ((x, y, z)= (w-a, $2^{2-c}$, b)), and the correction curve is generally a step-like curve. If the parameter x, i.e. the bit width a input to the NOR circuit 50a is changed, the output of the CF output section 42 is such that the size of the steps changes exponentially as indicated by L41 and L42. Specifically, the overall width and height of the steps when the parameter x=6 are about four times greater than those of the steps when the parameter x=5.

Further, if the bit width b for obtaining the parameter z, i.e. rs, is changed, the width (resolution) of each step changes as indicated by L41 and L44. The width corresponds to 4 bits in L41 with z=4, and 2 bits in L44 with z=2.

Further, if the parameter y, i.e. the parameter c for determining to which value of CF the bits ns(0) to ns(3) correspond, is changed, the maximum value changes while the number of the steps remains unchanged as indicated by L41 and L43. It thus corresponds to the shift amount of the mask value. A difference in height between at y=4 and at y=2 is 2 bits.

In this way, the output of the CF output section 42 can be changed as needed by varying (x, y, z)=(w-a, $2^c$, b). In this embodiment, a logical OR of the CF output and the value $A_M$ is calculated as a value after the correction.

Figure 10:
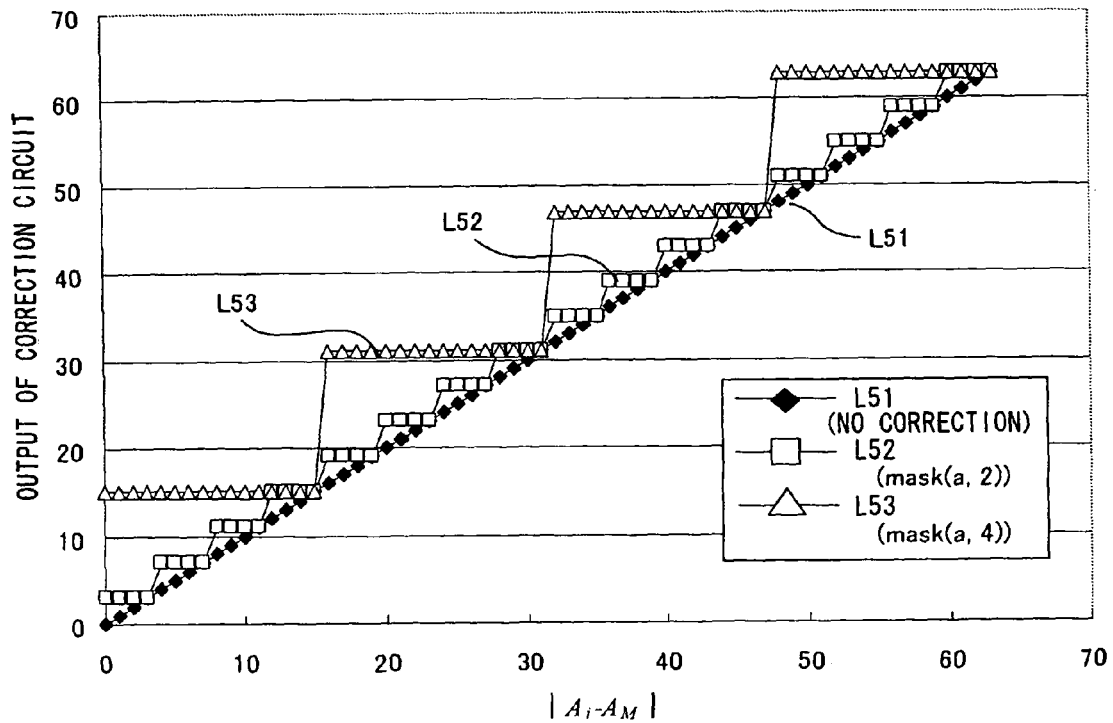
FIG. 10 is a graph showing the outputs of a correction circuit when no correction is made (the value of $A_M$) and when CF outputs=2 and 4, respectively.
Figure 11:
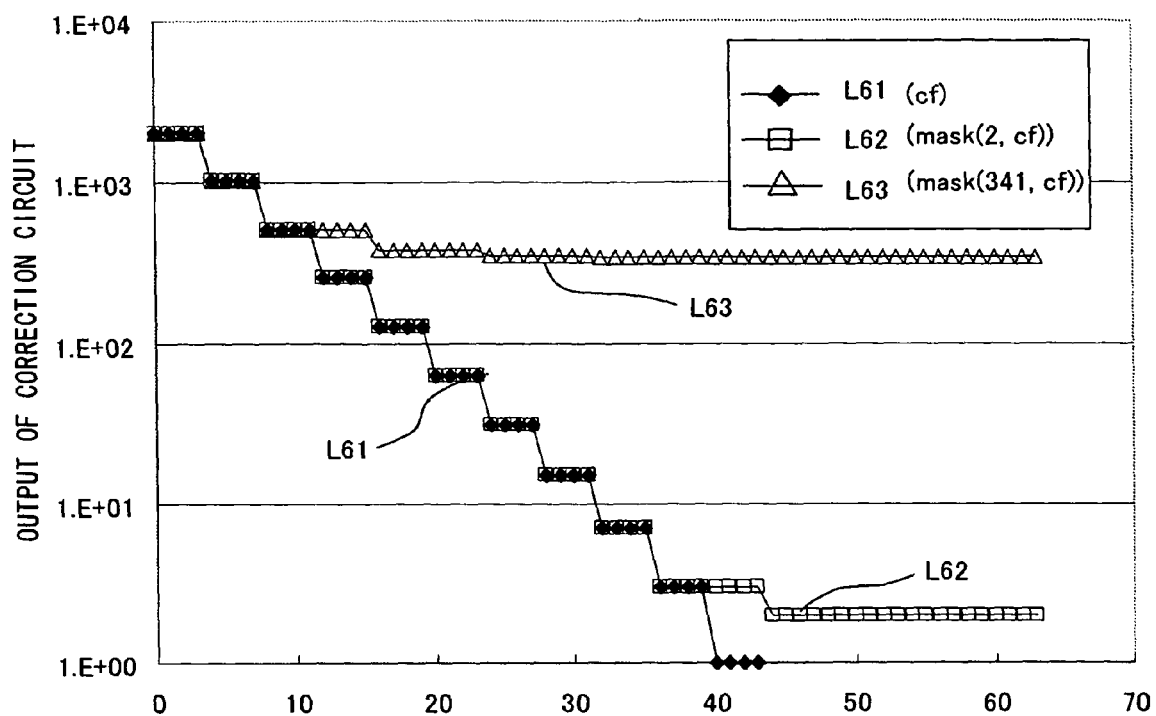
FIG. 11 is a graph showing the output of a correction circuit when $A_M=0$ and the outputs logical ORed with the CF output when $A_M=2$ and 341, respectively.

In FIG. 10, the curve L51 indicates the outputs s of the correction circuit 33 when no correction is made (the value of $A_M$), and the curves L52 and L53 indicate the same when CF outputs=2 and 4, respectively. In FIG. 11, the curve L61 indicates the outputs s of the correction circuit 33 when $A_M$=0, and the curves L62 and L63 indicate the outputs s of the correction circuit 33 which are logical ORed with the CF output 42 when $A_M$=2 and 341, respectively. As described in the first embodiment, because the both of the CF output and the value $A_M$ change in practice, the output s of the correction circuit 33 is a value which changes three-dimensionally in combination of those.

As shown in FIG. 10, the curve L52 indicates the case where 2 bits from LSB are masked as 1, and the curve L53 indicates the case where 4 bits from LSB are masked as 1. The graph of FIG. 10 shows that a larger correction is made as the value of $|A_i-A_M|$ is smaller. The graph of FIG. 11 also shows that the correction amount becomes smaller as the value of $|A_i-A_M|$ is larger.

In this embodiment as well, by varying the values of the parameters a, b and c appropriately, the Jacobian correction factor can be calculated accurately without increasing the circuit size. Further, this embodiment eliminates the need for an adder and therefore enables further reduction of the circuit size compared with the first embodiment.

Figure 12:
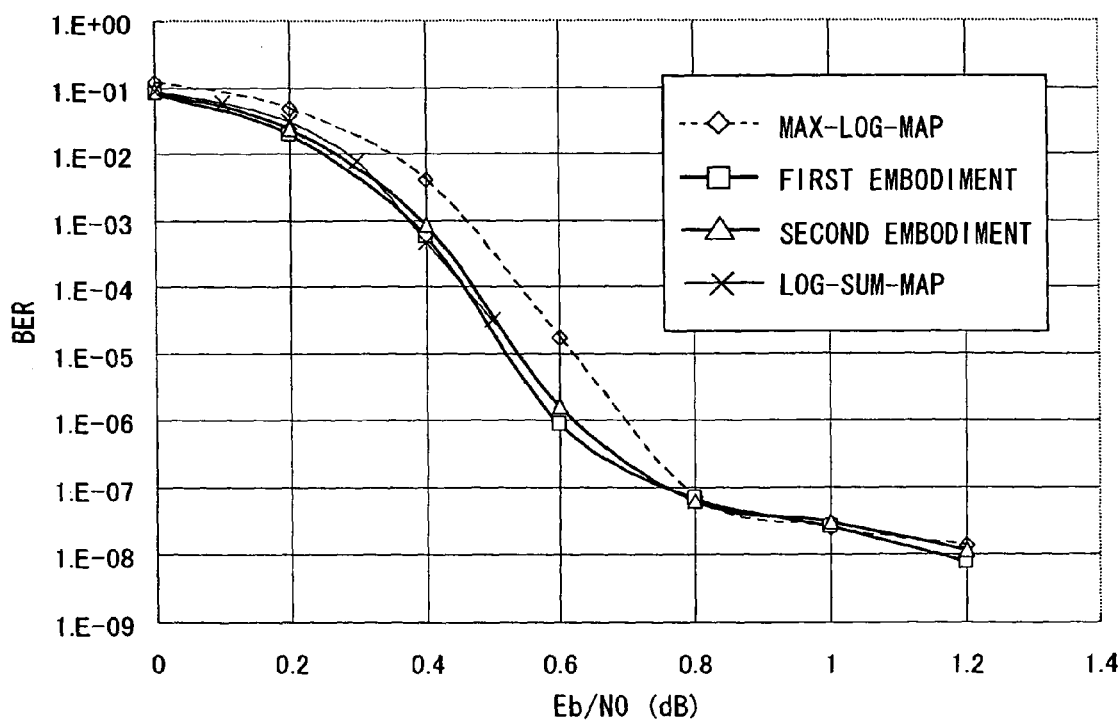
FIG. 12 is a graph showing the calculation results in the arithmetic circuits according to the first and second embodiments in comparison with the results when using the conventional technique (Max-Log-MAP) and using Log-sum-MAP (with the use of LUT)

The effects of the present invention are described hereinafter. FIG. 12 is a graph showing the calculation results in the arithmetic circuits according to the first and second embodiments in comparison with the results when using the conventional technique (Max-Log-MAP) and Log-sum-MAP (with the use of LUT). The graph shows that BER which is equal to Log-sum-MAP and significantly better than Max-Log-MAP is obtained in the first and second embodiments. Although the arithmetic circuit of the first embodiment has a larger circuit size than the arithmetic circuit of the second embodiment due to the presence of an adder, it provides highly accurate correction of the value $A_M$.

Figure 13:
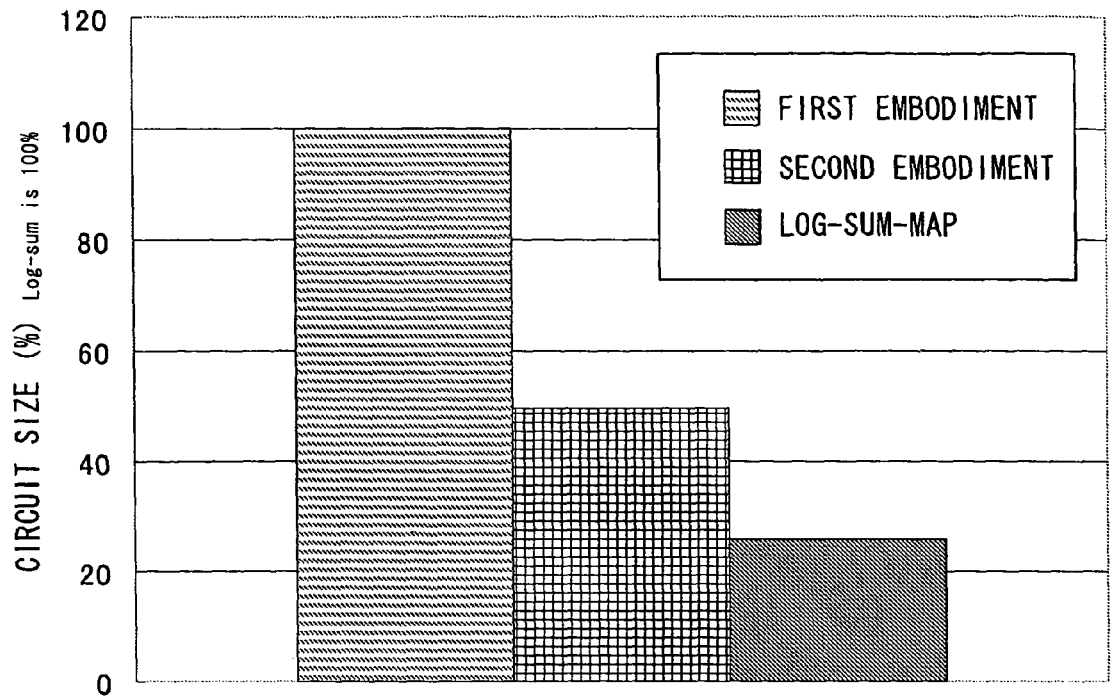
FIG. 13 is a view showing the effect of the present invention regarding a circuit size.
Figure 14:
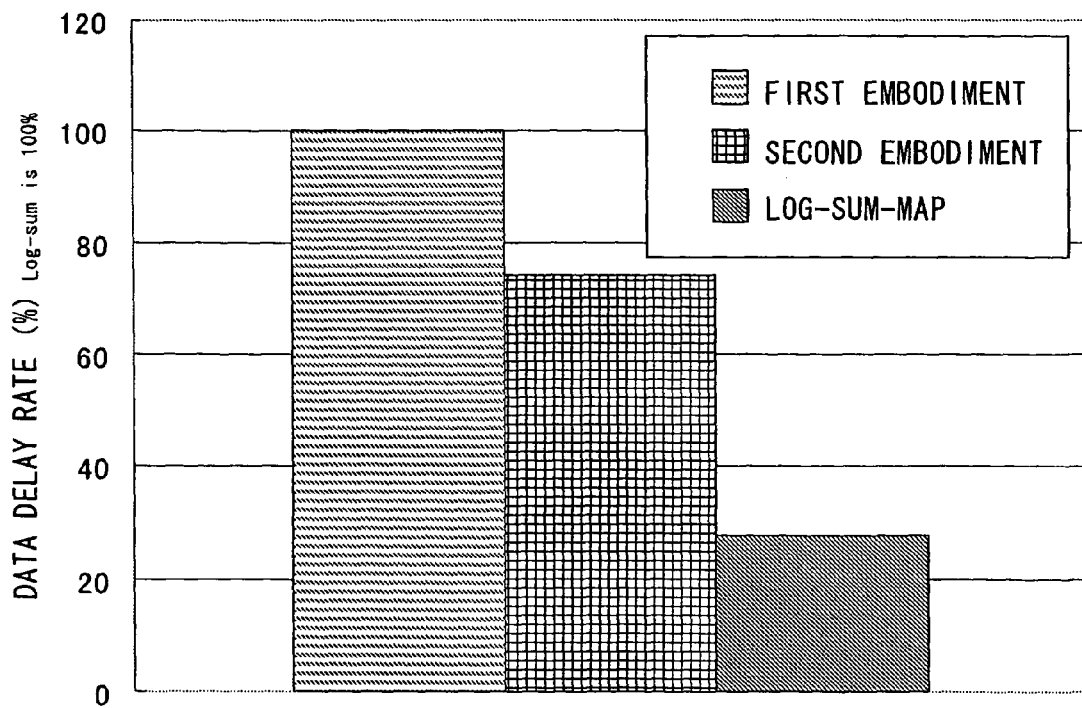
FIG. 14 is a view showing the effect of the present invention regarding a data delay rate.
Figure 15:
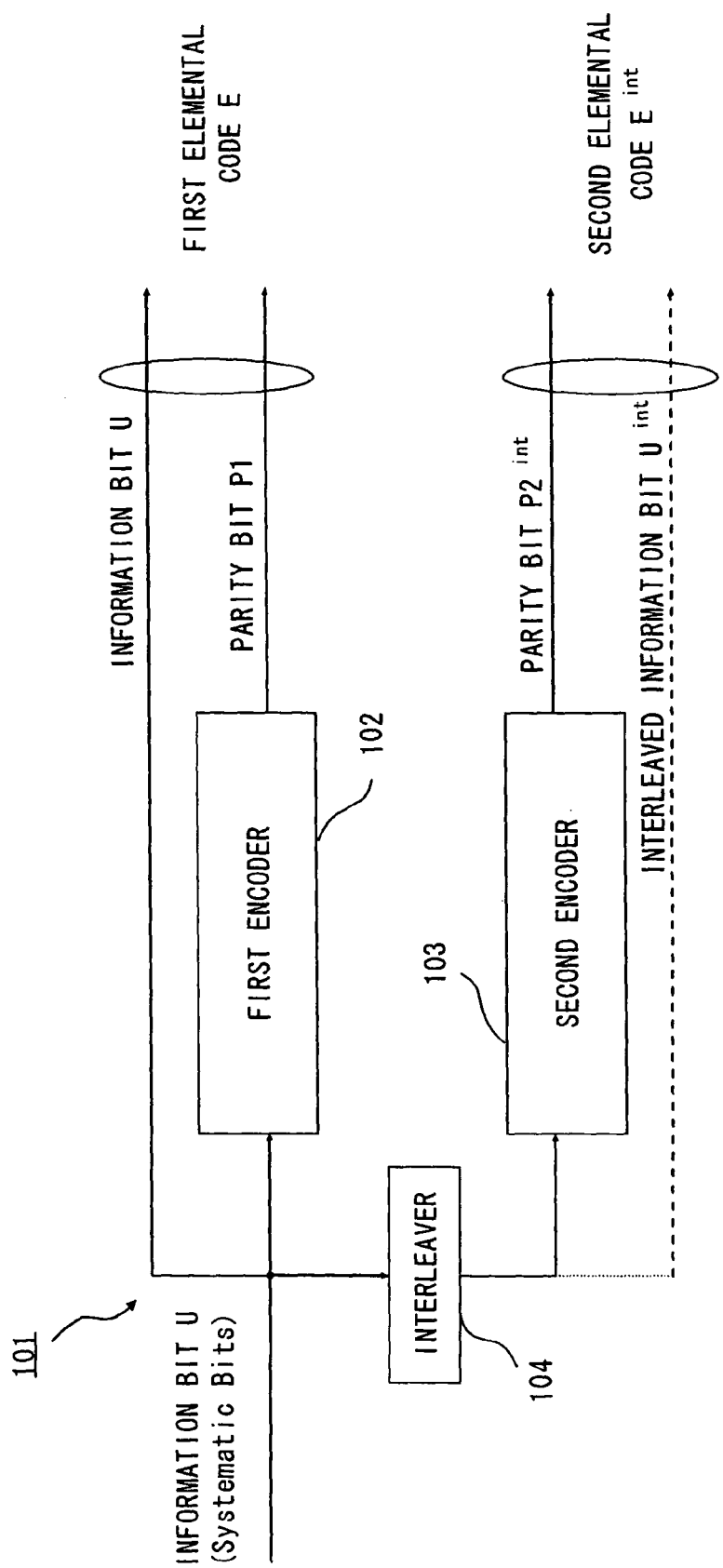
FIG. 15 is a view showing a typical encoding device for generating turbo codes.

FIGS. 13 and 14 are views showing the effects of the present invention regarding a circuit size and a data delay rate, respectively. As shown in FIGS. 13 and 14, the circuit size and the data delay rate are large when using Log-sum-MAP (with the use of LUT). In contrast, the circuit size and the data delay rate are significantly improved in the arithmetic circuit according to the first and second embodiments.

The present invention is not limited to the above-described embodiments, and various changes may be made without departing from the scope of the invention. For example, although this embodiment describes the case of calculating the maximum value of the inputs I1 and I2 and correcting this value in the correction circuit 33 by way of example, it is possible to calculate the minimum value of the inputs I1 and I2 and make a correction thereto. In such a case, a minimum value is determined in the ACS circuit 2, and the correction circuit 33 is replaced by a correction circuit for correcting the minimum value. The correction circuit may include a mask value generator for calculating a mask value based on the path metric value composed of a plurality of bits, a mask processor for performing mask processing on the path metric value based on the mask value, and a logic circuit for calculating a logical AND of the minimum value and the inverted output of the mask processor.

The mask value generator may include first to third logic circuits. Specifically, the first logic circuit calculates 1-bit inverted logical OR from all of the first bit group containing 0 bit or more of high-order bits of the path metric value composed of a plurality of bits. The second logic circuit performs logical operation on the second bit group containing 1 bit or more of high-order bits of the remainder of the path metric value composed of a plurality of bits excluding the first bit group and generates the third bit group containing 1 bit or more. The third logic circuit outputs the mask value that is the result of calculating the logical AND of the output of the first logic circuit and each bit of the third bit group. The mask processor may include an output section and a fourth logic circuit. Specifically, the output section generates a correction value of the same bits as the path metric value based on the mask value and outputs an inverted value of the same. The fourth logic circuit calculates a logical AND of the inverted output and the minimum value from the ACS circuit.

In such a case, as described in the above embodiments, the bit width of the path metric value is w, each bit of the path metric value is x(j) ($0 \leq j \leq w-1$), the bit width of the first bit group is a ($1 \leq a \leq w-1$), the bit width of the second bit group is b ($1 \leq b \leq w-a-1$), and the parameter for defining the relationship between the mask value and the correction output is c ($-w \leq c \leq w$). Then, the output value sf from the first logic circuit, the second bit group y(i), the output value rs from the second logic circuit, the output value ns from the third logic circuit, and the output value CF from the output section respectively satisfy the following Expressions. In this way, when correcting a minimum value, the value CF should be a complement of 1, which requires the operation of inverting the correction value.

$$sf = \left| \prod_{k=w-a}^{w-1} \{x(k)-1\} \right|$$

$$y(i) = |x(w-a-b+i)-1|_{i=0,\ldots,b-1}$$

$$rs = 2^{(2^b-1-y)} - 1$$

$$ns = \left( \frac{rs}{2^{2^b-1-c}} \right) \times sf$$

$$CF = \text{one's complement}(ns)$$

It is apparent that the present invention is not limited to the above embodiment that may be modified and changed without departing from the scope and spirit of the invention.

What is claimed is:

1. An arithmetic circuit for correcting an approximate value computed by Max-Log-MAP algorithm based on Log-MAP algorithm, the circuit comprising:
   a minimum value output circuit outputting a minimum value in Max-Log-MAP algorithm; and
   a correction circuit correcting the minimum value,
   the correction circuit including:
   a mask value generator calculating a mask value based on a path metric value composed of a plurality of bits;
   a mask processor performing mask processing on the path metric value based on the mask value; and
   a logic circuit calculating a logical AND of the minimum value and an inverted output of the mask processor.

2. The arithmetic circuit according to claim 1, wherein the mask value generator includes:
   a first logic circuit calculating 1-bit inverted logical OR from all of a first bit group containing 1 or more high-order bit of a path metric value composed of a plurality of bits;
   a second logic circuit performing logical operation on a second bit group containing 1 or more high-order bit of a remainder of the path metric value composed of the plurality of bits excluding the first bit group and generating a third bit group containing 1 bit or more; and
   a third logic circuit outputting the mask value that is a result of calculating a logical AND of an output of the first logic circuit and each bit of the third bit group, and the mask processor includes:
   an output section generating a correction output of the same bit as the path metric value based on the mask value and outputting an inverted value of the correction output; and
   a fourth logic circuit calculating a logical AND of the inverted output and the minimum value.

3. The arithmetic circuit according to claim 2, wherein if a bit width of the path metric value is w, each bit of the path metric value is x(j) ($0 \leq j \leq w-1$), a bit width of the first bit group is a ($1 \leq a \leq w-1$), a bit width of the second bit group is b ($1 \leq b \leq w-a-1$), and a parameter for defining a relationship between the mask value and the correction output is c ($-w \leq c \leq w$), an output value sf from the first logic circuit, the second bit group y(i), an output value rs from the second logic circuit, an output value ns from the third logic circuit, and an output value CF from the output section respectively satisfy following expressions:

$$sf = \left| \prod_{k=w-a}^{w-1} \{x(k) - 1\} \right|$$

$$y(i) = |x(w - a - b + i) - 1|_{i=0,\ldots,b-1}$$

$$rs = 2^{(2^b - 1 - y)} - 1$$

$$ns = \left( \frac{rs}{2^{2^b - 1 - c}} \right) \times sf$$

$$CF = \text{one's complement}(ns)$$

* * * * *